United States Patent
Han et al.

(10) Patent No.: US 12,016,190 B2
(45) Date of Patent: Jun. 18, 2024

(54) ELECTROLUMINESCENT DEVICE, AND DISPLAY DEVICE COMPRISING THEREOF

(71) Applicant: SAMSUNG ELECTRONICS CO., LTD., Suwon-si (KR)

(72) Inventors: Moon Gyu Han, Suwon-si (KR); Dae Young Chung, Suwon-si (KR); Kwanghee Kim, Seoul (KR); Eun Joo Jang, Suwon-si (KR); Chan Su Kim, Seoul (KR); Kun Su Park, Seongnam-si (KR); Won Sik Yoon, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 138 days.

(21) Appl. No.: 17/318,460

(22) Filed: May 12, 2021

(65) Prior Publication Data

US 2021/0273190 A1 Sep. 2, 2021

Related U.S. Application Data

(63) Continuation of application No. 16/811,637, filed on Mar. 6, 2020, now Pat. No. 11,038,136, which is a
(Continued)

(30) Foreign Application Priority Data

Sep. 7, 2018 (KR) .................. 10-2018-0107005

(51) Int. Cl.
*H10K 50/115* (2023.01)
*H10K 50/15* (2023.01)
(Continued)

(52) U.S. Cl.
CPC .......... *H10K 50/115* (2023.02); *H10K 50/15* (2023.02); *H10K 50/157* (2023.02);
(Continued)

(58) Field of Classification Search
CPC .... H10K 50/115; H10K 50/15; H10K 50/157; H10K 85/6572; H01L 51/502
See application file for complete search history.

(56) References Cited

U.S. PATENT DOCUMENTS 9,073,752 B2 7/2015 Kang et al.
9,273,000 B2 3/2016 Hayashi et al.
(Continued)

FOREIGN PATENT DOCUMENTS

CN 103345884 A 10/2013
CN 103427049 A 12/2013
(Continued)

OTHER PUBLICATIONS

Extended European Search Report dated Dec. 19, 2019, of the corresponding European Patent Application No. 19195539.2.
(Continued)

*Primary Examiner* — Alia Sabur
(74) *Attorney, Agent, or Firm* — CANTOR COLBURN LLP

(57) ABSTRACT

An electroluminescent device includes a first electrode and a second electrode facing each other; an emission layer disposed between the first electrode and the second electrode and including a plurality of quantum dots and a first hole transporting material having a substituted or unsubstituted C4 to C20 alkyl group attached to a backbone structure; a hole transport layer disposed between the emission layer and the first electrode and including a second hole transporting material; and an electron transport layer disposed between the emission layer and the second electrode.

20 Claims, 10 Drawing Sheets

Related U.S. Application Data continuation-in-part of application No. 16/562,601, filed on Sep. 6, 2019.

(51) Int. Cl.
  H10K 50/16       (2023.01)
  H10K 71/00       (2023.01)
  H10K 85/60       (2023.01)
  H10K 101/00      (2023.01)
  H10K 102/00      (2023.01)

(52) U.S. Cl.
  CPC .......... H10K 50/167 (2023.02); H10K 71/00 (2023.02); H10K 85/631 (2023.02); H10K 85/633 (2023.02); H10K 50/16 (2023.02); H10K 2101/00 (2023.02); H10K 2102/331 (2023.02)

(56) References Cited

U.S. PATENT DOCUMENTS

| | | |
|---|---|---|
| 9,281,482 B2 | 3/2016 | Song et al. |
| 9,362,334 B2 | 6/2016 | Zhang et al. |
| 9,590,191 B2 | 3/2017 | Song et al. |
| 9,608,210 B2 | 3/2017 | Song et al. |
| 9,978,972 B2 | 5/2018 | Chao |
| 10,797,113 B2 | 10/2020 | Ohsawa et al. |
| 11,038,136 B2* | 6/2021 | Han .................. H10K 50/167 |
| 2006/0083694 A1 | 4/2006 | Kodas et al. |
| 2008/0315757 A1 | 12/2008 | McKiernan et al. |
| 2009/0087792 A1 | 4/2009 | Yasuhiro et al. |
| 2009/0096363 A1 | 4/2009 | Burroughes et al. |
| 2010/0237322 A1* | 9/2010 | Okada .................. H10K 50/115 257/13 |
| 2013/0011952 A1 | 1/2013 | Hayashi et al. |
| 2015/0162537 A1* | 6/2015 | Song .................... C09K 11/06 257/40 |
| 2016/0240730 A1 | 8/2016 | Murayama et al. |
| 2016/0293875 A1 | 10/2016 | Zhang et al. |
| 2016/0365478 A1 | 12/2016 | Shim et al. |
| 2017/0077406 A1 | 3/2017 | Xie |
| 2017/0213876 A1 | 7/2017 | Ohsawa et al. |
| 2018/0019371 A1 | 1/2018 | Steckel et al. |
| 2018/0039103 A1 | 2/2018 | Jang et al. |
| 2018/0182969 A1 | 6/2018 | Fujiyama et al. |
| 2019/0153317 A1 | 5/2019 | Kim et al. |
| 2020/0350373 A1 | 11/2020 | Ohsawa et al. |
| 2021/0020699 A1* | 1/2021 | Yoshimura ........ G02F 1/133603 |
| 2022/0028937 A1 | 1/2022 | Ohsawa et al. |

FOREIGN PATENT DOCUMENTS

| | | |
|---|---|---|
| CN | 104693105 A | 6/2015 |
| CN | 105655495 A | 6/2016 |
| CN | 106784392 A | 5/2017 |
| CN | 106997890 A | 8/2017 |
| JP | H0525473 A | 2/1993 |
| JP | 2011192524 A | 9/2011 |
| JP | 2015156367 A | 8/2015 |
| JP | 5828340 B2 | 12/2015 |
| JP | 6168372 B2 | 7/2017 |
| JP | 2017139220 A | 8/2017 |
| KR | 20110127897 A | 11/2011 |
| KR | 20120018865 A | 3/2012 |
| KR | 20130013810 A | 2/2013 |
| KR | 20130047943 A | 5/2013 |
| KR | 1686104 B1 | 12/2016 |

OTHER PUBLICATIONS

Masanao Era et al., "Electrophosphorescence from hole-transporting layer doped with cerium halide nano-particles," Journal of Luminescence, Mar. 21, 2013, pp. 6-8, vol. 141.

Özlem Usluer et al., "White organic light emitting diodes based on fluorene-carbazole dendrimers," Journal of Luminescence, pp. 6-10, Sep. 25, 2013, vol. 146.

Non-Final Office Action dated Oct. 24, 2022 in App. U.S. Appl. No. 16/562,601.

Office Action dated Dec. 27, 2022, of the corresponding Japanese Patent Application No. 2019-163340.

U.S. Final Office Action dated Mar. 16, 2023 in U.S. Appl. No. 16/562,601.

Non-Final Office Action, dated Jul. 20, 2023 of U.S. Appl. No. 16/562,601.

Office Action dated Oct. 22, 2023 of the corresponding Korean Patent Application No. 10-2018-0107005.

OA dated Oct. 22, 2023 of the corresponding Korean Patent Application No. 10-2018-0107005.

Office Action dated Feb. 19, 2024, of the corresponding Chinese Patent Application No. 201910842105.4.

* cited by examiner

ELECTROLUMINESCENT DEVICE, AND DISPLAY DEVICE COMPRISING THEREOF

CROSS-REFERENCE TO RELATED APPLICATION

This application is a Continuation of U.S. patent application Ser. No. 16/811,637, filed on Mar. 6, 2020, which is a Continuation-In-Part application of U.S. patent application Ser. No. 16/562,601, filed on Sep. 6, 2019, which claims priority to and the benefit of Korean Patent Application No. 10-2018-0107005 filed in the Korean Intellectual Property Office on Sep. 7, 2018, and all the benefits accruing therefrom under 35 U.S.C. § 119, the entire contents of which are incorporated herein by reference.

BACKGROUND

1. Field

An electroluminescent device and a display device including the same are disclosed.

2. Description of the Related Art

Quantum dots are nanocrystal semiconductor materials having a diameter of less than or equal to around 10 nm, and show quantum confinement effects. Quantum dots generate stronger intensity light in a narrower wavelength region than the commonly used phosphor. Quantum dots emit light while the excited electrons are transited from a conduction band to a valence band and emission wavelengths vary depending upon a particle size of the quantum dots. Quantum dots can therefore be used to obtain light in a desirable wavelength region by adjusting the size of the quantum dots.

Advantages to electronic devices having an emission layer including quantum dots include reduced production cost, as compared to the organic light emitting diode (OLED) using an emission layer including phosphorescence and/or phosphor material. In addition, different colors may be emitted by changing the size of the quantum dots, whereas OLED devices require the use of different organic materials in the emission layer for emitting different colors of light.

The luminous efficiency of the emission layer including quantum dots is determined by quantum efficiency of quantum dots, a balance of charge carriers, light extraction efficiency, and the like. Particularly, in order to improve the quantum efficiency, the excitons may be confined in the emission layer, but when the excitons are not confined in the emission layer by a variety of factors, it may cause a problem such as exciton quenching.

SUMMARY

Provided are an electroluminescent device having improved device characteristics by improving hole transporting capability and surface characteristics of an emission layer and a display device including the same.

According to an embodiment, an electroluminescent device includes a first electrode and a second electrode facing each other; an emission layer disposed between the first electrode and the second electrode and including a plurality of quantum dots and a first hole transporting material. The electroluminescent device may further include a hole transport layer disposed between the emission layer and the first electrode, and including a second hole transporting material; and an electron transport layer disposed between the emission layer and the second electrode, or both of them.

The quantum dots are configured to emit a first light on excitation by light and the first hole transporting material is configured to emit a second light on excitation by light. The first light has a first (maximum) peak wavelength and the second light has a second (maximum) peak wavelength. In a time resolved photoluminescence spectroscopy analysis of the emission layer, t1 for the first light may be less than or equal to about 15 nanoseconds (ns) or less than or equal to about 10 ns.

In the time resolved photoluminescent spectroscopy analysis of the emission layer, a decay fraction of the t1 may be greater than or equal to about 5%, greater than or equal to about 10%, greater than or equal to about 15%, greater than or equal to about 20%.

In the time resolved photoluminescent spectroscopy analysis of the emission layer, an average decay time ($t_{avg}$) for the first light may be less than or equal to about 30 ns, or less than or equal to about 27 ns.

In the time resolved photoluminescent spectroscopy analysis of the emission layer, an average decay time ($t_{avg}$) for the second light may be less than or equal to about 0.7 ns.

In an analysis for an excitation wavelength dependent photoluminescence emission behavior, the emission layer may show a luminance intensity that is less than or equal to about 0.4, less than or equal to about 0.3, less than or equal to about 0.2 of a maximum intensity thereof, when an excitation light has a wavelength of the second peak wavelength.

In the analysis for an excitation wavelength dependent photoluminescence emission behavior, the emission layer may show a luminance intensity that is less than or equal to about 0.2, or less than or equal to about 0.1 of a maximum intensity thereof, when an excitation light has a wavelength of 450 nm.

The second peak wavelength may be less (e.g., shorter) than the first peak wavelength.

A difference between the second peak wavelength and the first peak wavelength may be greater than or equal to about 10 nm.

A difference between the second and the first peak wavelengths may be greater than or equal to about 150 nm.

When a voltage is applied, the emission layer may emit light of the same color as the first light.

The emission layer may be configured to emit light without a formation of a triplet emitter. The emission layer may not include an iridium containing organic metal compound, a platinum containing organic metal compound, or a combination thereof.

The first hole transporting material may include a substituted or unsubstituted C4 to C20 alkyl group attached to a backbone structure.

The first hole transporting material may include a compound represented by Chemical Formula 1.

Chemical Formula 1

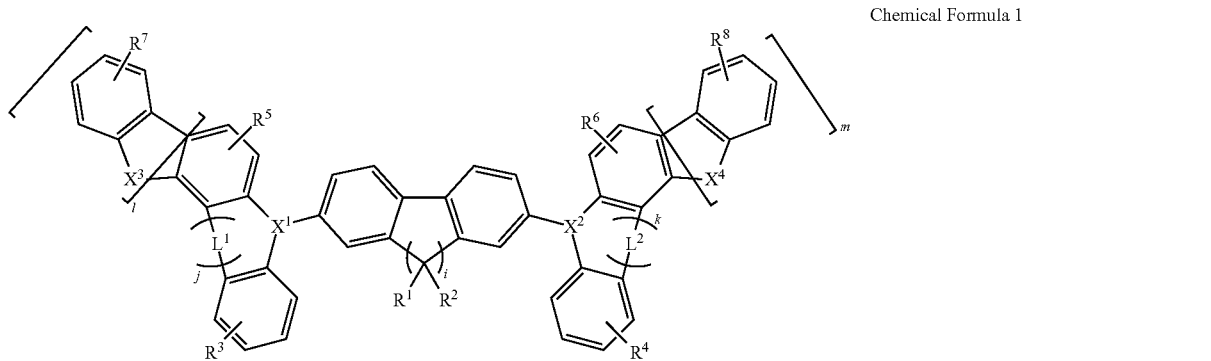

In Chemical Formula 1, $R^1$ to $R^8$ are each independently hydrogen, a C1 to C3 alkyl group, a substituted or unsubstituted C4 to C20 alkyl group, a substituted or unsubstituted C3 to C20 cycloalkyl group, a substituted or unsubstituted C6 to C20 aryl group, a substituted or unsubstituted C3 to C20 heteroaryl group, a substituted or unsubstituted C2 to C40 alkylamine group, or a substituted or unsubstituted C6 to C40 arylamine group, provided that at least one of $R^1$ to $R^8$ is a substituted or unsubstituted C4 to C20 alkyl group, and if any of $R^3$ to $R^8$ are a substituted or unsubstituted C3 to C20 cycloalkyl group, a substituted or unsubstituted C6 to C20 aryl group, or a substituted or unsubstituted C3 to C20 heteroaryl group, it may be each independently fused with an adjacent aromatic ring to provide a C8 to C15 fused ring, $X^1$ and $X^2$ are independently selected from N and $C(-R^a)$, and $X^3$ and $X^4$ are independently selected from S, $N-R^b$, and $C(-R^c)(-R^d)$, wherein $R^a$, $R^b$, $R^c$, and $R^d$ are independently selected from hydrogen, a substituted or unsubstituted C1 to C20 alkyl group, a substituted or unsubstituted C3 to C20 cycloalkyl group, a substituted or unsubstituted C6 to C20 aryl group, and a substituted or unsubstituted C3 to C20 heteroaryl group, $L^1$ and $L^2$ are independently selected from a single bond and a substituted or unsubstituted methylene group or C2 to C4 alkenylene group, and i, j, k, l, and m are independently 0 or 1.

The first hole transporting material may include a compound represented by Chemical Formula 2.

Chemical Formula 2

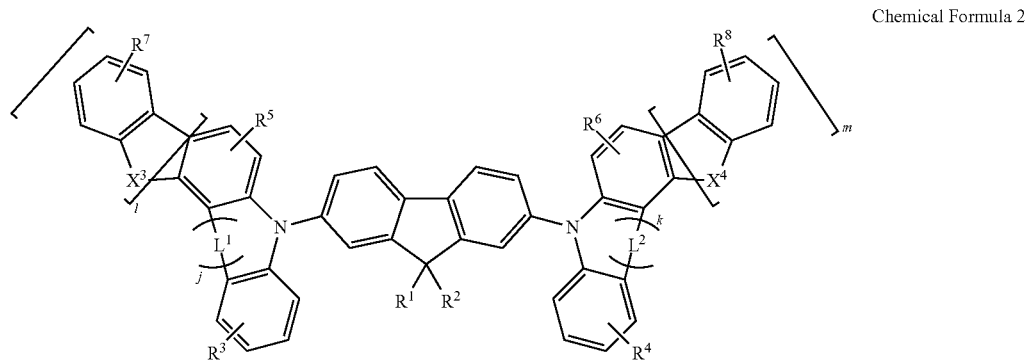

wherein, in Chemical Formula 2, $X^3$, $X^4$, $L^1$, $L^2$, j, k, l, and m are the same as defined in Chemical Formula 1, $R^1$ to $R^8$ are each independently hydrogen, a C1 to C3 alkyl group, a substituted or unsubstituted C4 to C20 alkyl group, a substituted or unsubstituted C3 to C20 cycloalkyl group, a substituted or unsubstituted C6 to C20 aryl group, a substituted or unsubstituted C3 to C20 heteroaryl group, a substituted or unsubstituted C2 to C40 alkylamine group, or a substituted or unsubstituted C6 to C40 arylamine group, provided that at least one of $R^1$ to $R^6$ is a substituted or unsubstituted C4 to C20 alkyl group.

If any of $R^3$ to $R^6$ are one of a substituted or unsubstituted C3 to C20 cycloalkyl group, a substituted or unsubstituted C6 to C20 aryl group, or a substituted or unsubstituted C3 to C20 heteroaryl group, it may be each independently fused with an adjacent aromatic ring to provide a C8 to C40 fused ring.

At least two of $R^1$ to $R^6$ may be a substituted or unsubstituted C4 to C20 alkyl group.

The first hole transporting material may include at least one of compounds represented by Chemical Formula 2-1 to Chemical Formula 2-2.

Chemical Formula 2-1

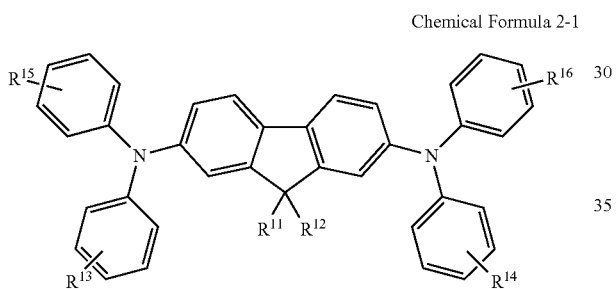

Chemical Formula 2-2

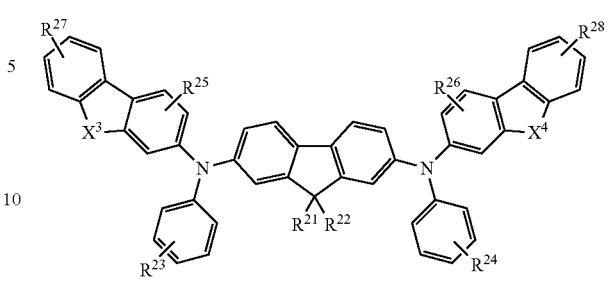

In Chemical Formula 2-1 to Chemical Formula 2-2, $X^3$ and $X^4$ are the same as defined in Chemical Formula 1, $R^{11}$, $R^{12}$, $R^{13}$, $R^{14}$, $R^{15}$, $R^{16}$, $R^{21}$, $R^{22}$, $R^{23}$, $R^{24}$, $R^{25}$, and $R^{26}$ are each independently hydrogen, a C1 to C3 alkyl group, a substituted or unsubstituted C4 to C20 alkyl group, a substituted or unsubstituted C3 to C20 cycloalkyl group, a substituted or unsubstituted C6 to C20 aryl group, a substituted or unsubstituted C3 to C20 heteroaryl group, provided that at least one of $R^{11}$ to $R^{14}$ and at least one of $R^{21}$ to $R^{26}$ are a substituted or unsubstituted C4 to C20 alkyl group, $R^{27}$ and $R^{28}$ are each independently hydrogen, a C1 to C3 alkyl group, a substituted or unsubstituted C2 to C40 alkylamine group, a substituted or unsubstituted is C6 to C40 arylamine group, or a substituted or unsubstituted carbazolyl group, and If any of $R^{13}$, $R^{14}$, $R^{15}$, $R^{16}$, $R^{23}$, $R^{24}$, $R^{25}$, and $R^{26}$ is one of a substituted or unsubstituted C3 to C20 cycloalkyl group, a substituted or unsubstituted C6 to C20 aryl group, or a substituted or unsubstituted C3 to C20 heteroaryl group, it may be each independently fused with an adjacent aromatic ring to provide a C8 to C40 fused ring.

The first hole transporting material may include a compound represented by Chemical Formula 3.

Chemical Formula 3

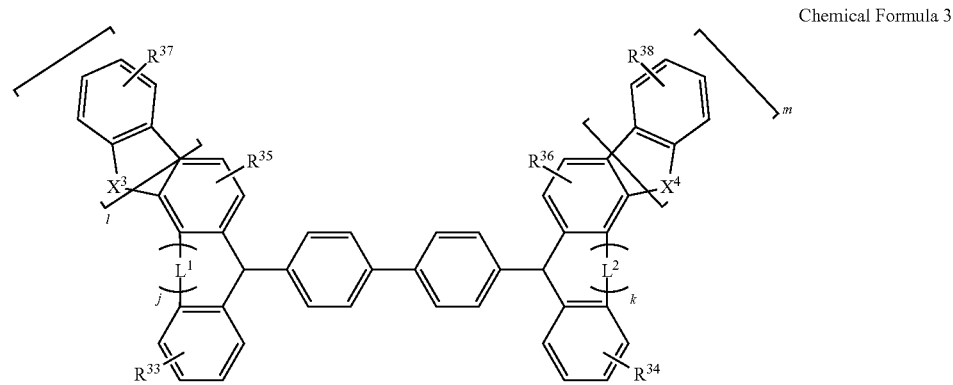

In Chemical Formula 3, $X^3$, $X^4$, $L^1$, $L^2$, j, k, l, and m are independently the same as defined in Chemical Formula 1, $R^{33}$, $R^{34}$, $R^{35}$, $R^{36}$, $R^{37}$, and $R^{38}$ are each independently hydrogen, a C1 to C3 alkyl group, a substituted or unsubstituted C4 to C20 alkyl group, a substituted or unsubstituted C3 to C20 cycloalkyl group, a substituted or unsubstituted C6 to C20 aryl group, a substituted or unsubstituted C3 to C20 heteroaryl group, a substituted or unsubstituted C2 to C40 alkylamine group, or a substituted or unsubstituted C6 to C40 arylamine group, provided that at least one of $R^{33}$ to $R^{38}$ is a substituted or unsubstituted C4 to C20 alkyl group.

If any of $R^{33}$, $R^{34}$, $R^{35}$, $R^{36}$, $R^{37}$, and $R^{38}$ is a substituted or unsubstituted C3 to C20 cycloalkyl group, a substituted or unsubstituted C6 to C20 aryl group, or a substituted or unsubstituted C3 to C20 heteroaryl group, it may be each independently fused with an adjacent aromatic to provide a C8 to C40 fused ring.

At least two of $R^{33}$ to $R^{36}$ may be an unsubstituted C4 to C10 linear or branched alkyl group.

The first hole transporting material may include at least one of compounds represented by Chemical Formula A to Chemical Formula F.

Chemical Formula A

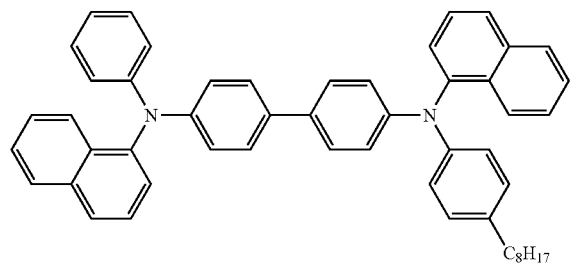

Chemical Formula B

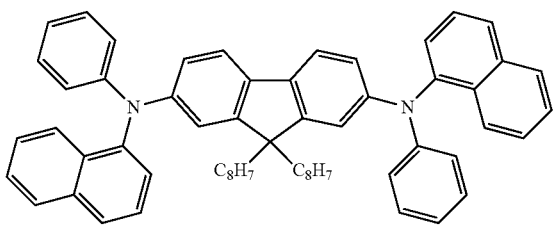

Chemical Formula C

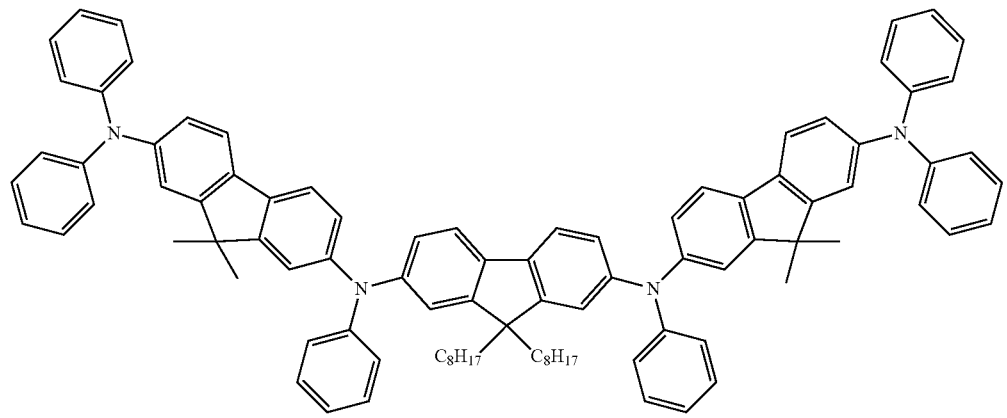

Chemical Formula D

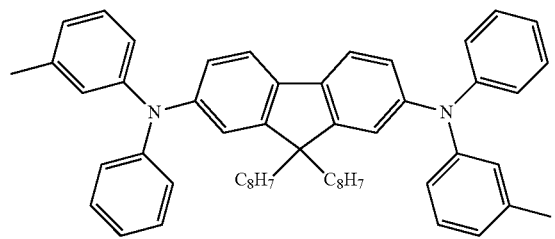

Chemical Formula E

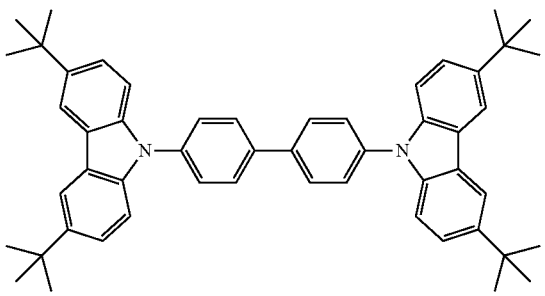

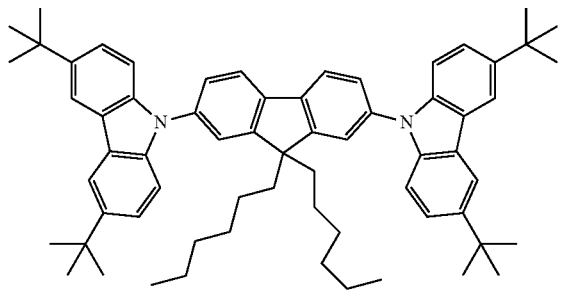

Chemical Formula F

The first hole transporting material may have a solubility (e.g., of at least 1 wt %) in a non-polar solvent, thereby forming a solution when it is dissolved in the non-polar solvent.

The first hole transporting material may be included in an amount of greater than or equal to 2 weight percent (wt %) and less than 50 wt % based on a total weight of the emission layer.

A root mean square roughness of the surface of the emission layer measured by atomic-force microscopy (AFM) may be about 0.5 nm to about 2.0 nm.

The plurality of quantum dots may further include a hydrophobic (organic) ligand bound to a surface thereof.

The emission layer (or the quantum dots) may not include cadmium. The quantum dots may include a core including a first semiconductor nanocrystal, and a shell disposed on the core and including a second semiconductor nanocrystal.

The plurality of quantum dots (or the first or the second semiconductor nanocrystal) may include each independently a Group II-VI compound, a Group III-V compound, a Group IV-VI compound, a Group IV element or compound, a Group I-III-VI compound, a Group I-II-IV-VI compound, or a combination thereof.

The second hole transporting material and the first hole transporting material may be a different material.

The second hole transporting material may include a poly(3,4-ethylenedioxythiophene) or derivative, a poly(styrene sulfonate) or derivative, a poly(N-vinylcarbazole) or derivative, a poly(phenylene vinylene) or derivative, a poly((C1 to C6 alkyl)(meth)acrylate) or derivative, a poly(C6 to C40 arylamine) or derivative, a polyaniline or derivative, a polypyrrole or derivative, a poly(9,9-dioctylfluorene) or derivative, a poly(spiro-fluorene) or derivative, a poly-(N, N'-diphenyl-N,N'-bis(3-methylphenyl)-(1,1'-biphenyl)-4,4'-diamine) or derivative, NiO, MoO$_3$, or a combination thereof.

The electron transport layer may include an inorganic nanoparticle, a quinolone compound, a triazine compound, a quinoline compound, a triazole compound, a naphthalene compound, or a combination thereof.

The electron transport layer may include a plurality of inorganic nanoparticles. The inorganic nanoparticle may include a compound represented by Chemical Formula A:

$$Zn_{1-x}M_xO$$  Chemical Formula A wherein, in Chemical Formula 1,
M is Mg, Ca, Zr, W, Li, Ti, Y, Al, or a combination thereof, and
$0 \leq x \leq 0.5$.

The electroluminescent device may have a maximum external quantum efficiency (EQE) of greater than or equal to about 10%. The device may have a maximum luminance of greater than or equal to about 10,000 candela per square meter (cd/m$^2$). The electroluminescent device may have a peak capacitance of greater than or equal to about 0.8 nanofarads (nF), greater than or equal to about 1 nF, greater than or equal to about 8 nF, and less than or equal to about 50 nF. The electroluminescent device may have T90 (or T95) of greater than or equal to about 20 hours, when it is operated at 1,500 candela per square meter (cd/m$^2$, also referred to herein as "nit").

The electron transport layer may have an average thickness of about 20 nanometers (nm) to about 100 nm.

A hole injection layer may be further disposed between the first electrode and the hole transport layer.

According to another embodiment, a display device including the electroluminescent device is provided.

The electroluminescent device having improved device characteristics due to improved hole transporting capability and surface characteristics of the emission layer and a display device including the same are provided.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
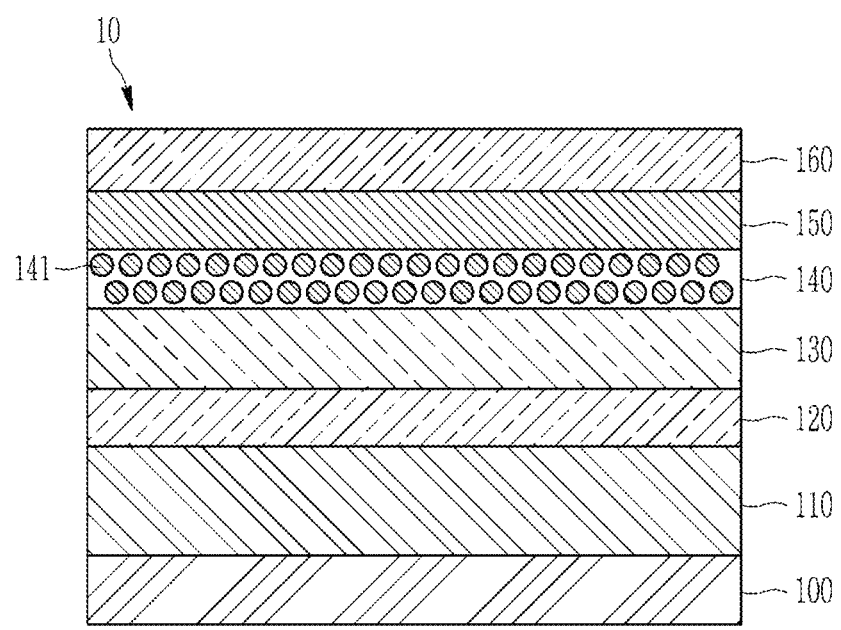
FIG. 1 is a schematic cross-sectional view of an electroluminescent device according to an embodiment.
Figure 2:
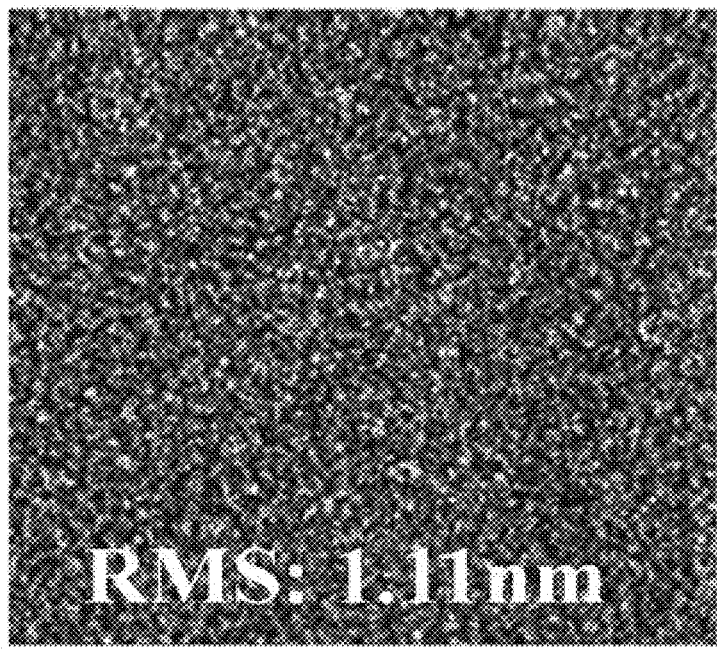
FIGS. 2 to 5 are atomic force microscopic (AFM) images showing surface morphology of the emission layer thin films (Comparative Preparation Example 1 (FIG. 2), Preparation Example 3 (FIG. 3), Comparative Preparation Example 2 (FIG. 4), and Preparation Example 5 (FIG. 5))
Figure 3:
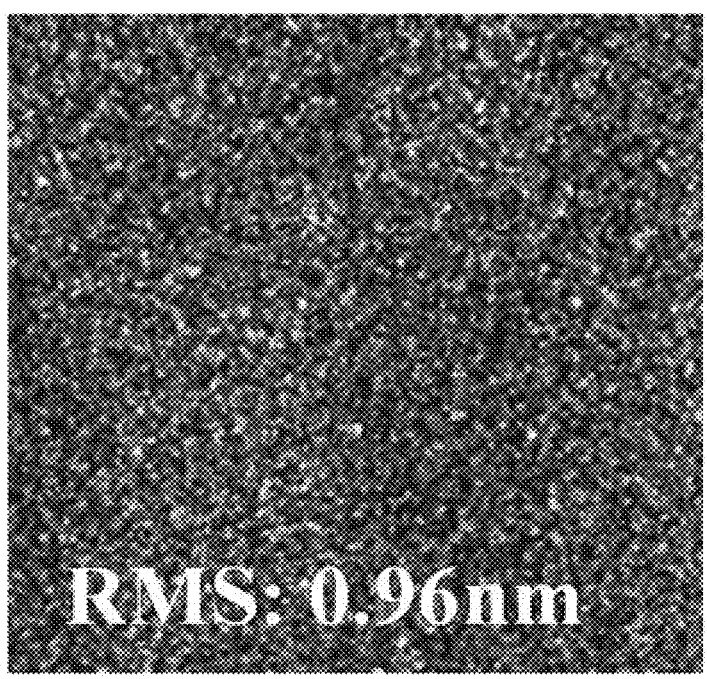
Figure 4:
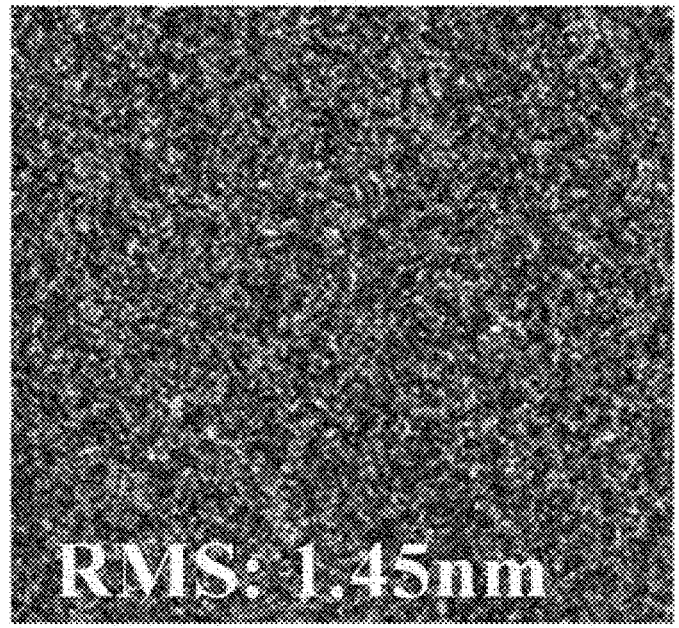
Figure 5:
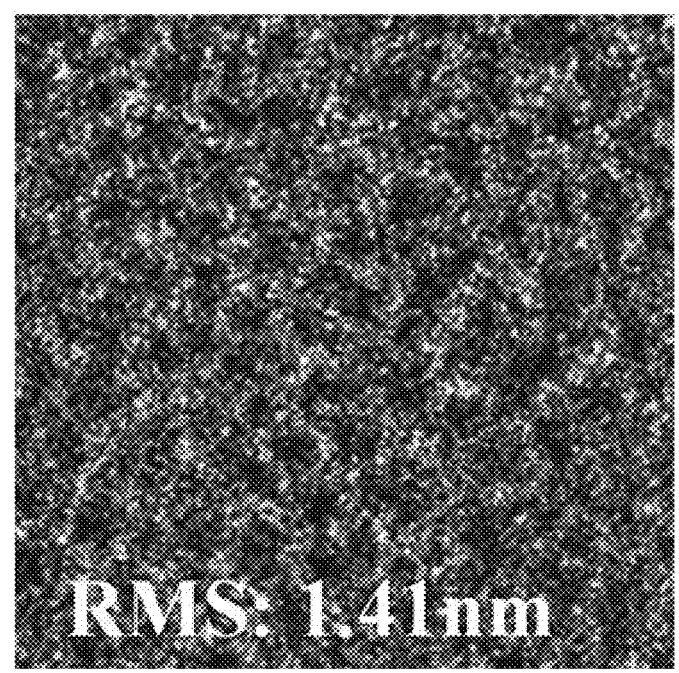
Figure 6:
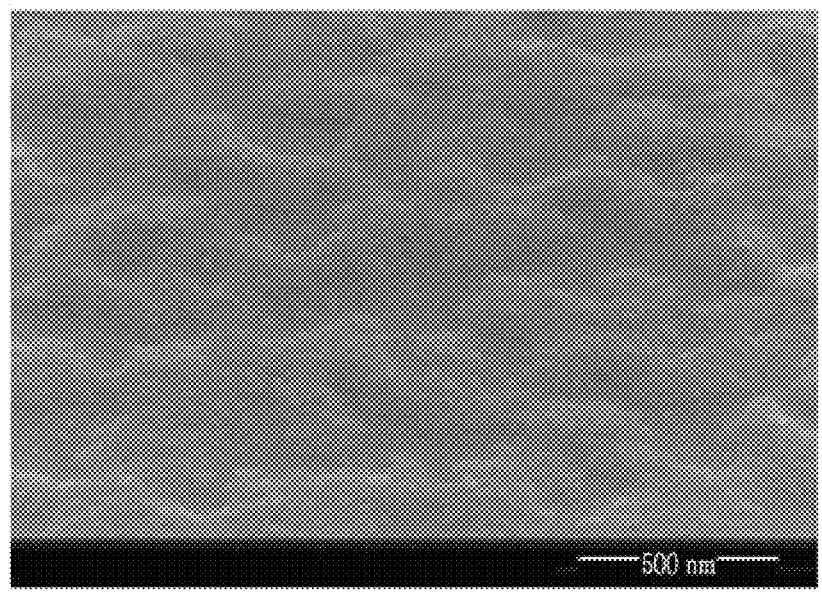
FIGS. 6 to 9 are scanning electron microscopic images of the emission layer thin films (Comparative Preparation Example 3 (FIG. 6), Comparative Preparation Example 4 (FIG. 7), Preparation Example 10 (FIG. 8), and Preparation Example 11 (FIG. 9))
Figure 7:
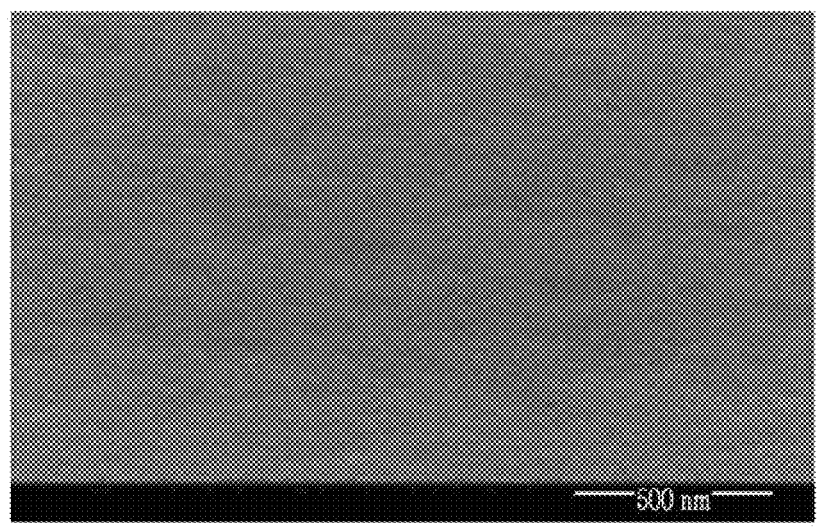

Example embodiments of the present disclosure will hereinafter be described in detail, and may be easily performed by a person having an ordinary skill in the related art. However, this disclosure may be embodied in many different forms, and is not to be construed as limited to the example embodiments set forth herein.

As used herein, the singular forms "a," "an," and "the" are intended to include the plural forms, including "at least one," unless the content clearly indicates otherwise. "Combinations" is inclusive of blends, mixtures, alloys, reaction products, and the like. "Or" means "and/or" unless clearly indicated otherwise by context. Reference throughout the specification to "an embodiment" means that a particular element described in connection with the embodiment is included in at least one embodiment described herein, and may or may not be present in other embodiments. The described elements may be combined in any suitable manner in the various embodiments. "Combination thereof" is an open term that includes one or more of the named elements, optionally together with a like element not named.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The endpoints of all ranges directed to the same component or property are inclusive and independently combinable (e.g., ranges of "less than or equal to 25 wt %, or 5 wt % to 20 wt %," is inclusive of the endpoints and all intermediate values of the ranges of "5 wt % to 25 wt %," etc.). Disclosure of a narrower range or more specific group in addition to a broader range is not a disclaimer of the broader range or larger group. "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. In the drawings, the thickness of layers, films, panels, regions, etc., are exaggerated for clarity. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims. Like reference numerals designate like elements throughout the specification and drawings.

Spatially relative terms, such as "beneath," "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, the term "alkyl group" refers to a group derived from a straight or branched chain saturated aliphatic hydrocarbon having the specified number of carbon atoms and having a valence of at least one. Specific examples of the alkyl group may be a methyl group, an ethyl group, an isopropyl group, a tert-butyl group, an n-octyl group, an n-decyl group, an n-hexadecyl group, and the like.

As used herein, the term "alkenyl group" refers to a straight or branched chain, monovalent hydrocarbon group having at least one carbon-carbon double bond.

Specific examples of the alkenyl group may be a vinyl group, an allyl group, a 2-butenyl group, a 3-pentenyl group, and the like.

As used herein, the term "alkynyl group" refers to a straight or branched chain, monovalent hydrocarbon group having at least one carbon-carbon triple bond.

Specific examples of the alkynyl group may be a propargyl group, a 3-pentynyl group, and the like.

As used herein, the term "alkoxy group" refers to "alkyl-O—", wherein the term "alkyl" has the same meaning as described above.

As used herein, the term "cycloalkyl group" refers to a monovalent group having one or more saturated rings in which all ring members are carbon.

As used herein, the term "aryl group" refers to an aromatic hydrocarbon containing at least one ring and having the specified number of carbon atoms. The term "aryl" may be construed as including a group with an aromatic ring fused to at least one cycloalkyl ring.

As used herein, the term "arylalkylene group" refers to an alkylene group substituted with an aryl group.

As used herein, the term "heteroaryl group" refers to an aryl group containing one to three heteroatoms selected from the group consisting of N, O, S, Si, and P as ring-forming elements, and optionally substituted with one or more substituents where indicated. Examples of heteroaryl groups include, but are not limited to, pyridyl, indolyl, carbazolyl, pyrimidinyl, pyridizinyl, pyrazinyl, imidazolyl, oxazolyl, furanyl, thiophenyl, thiazolyl, triazolyl, tetrazolyl, isoxazolyl, quinolinyl, pyrrolyl, pyrazolyl, benz[b]thiophenyl, isoquinolinyl, quinazolinyl, quinoxalinyl, thienyl, isoindolyl, and 5,6,7,8-tetrahydroisoquinoline.

As used herein, when a definition is not otherwise provided, the term "heteroarylalkylene" refers to an alkylene group substituted with a heteroaryl group.

As used herein, the terms "alkylene", "cycloalkylene", "arylene", and "heteroarylene" refer to a divalent group respectively derived from an alkyl group, a cycloalkyl group, an aryl group, and a heteroaryl group as defined above.

As used herein, the term "alkylamine group" refers to —NRR' wherein R and R' are each independently a C1 to C20 alkyl group. As used herein, the term "arylamine group" refers to —NRR' wherein R and R' are each independently a C6 to C30 aryl group.

As used herein, when a definition is not otherwise provided, "substituted" refers to a group or compound wherein at least one of the hydrogen atoms thereof is substituted with a halogen atom (F, Cl, Br, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxylic acid group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, or a combination thereof. "Substituted" is intended to be non-limiting and include inorganic substituents or organic substituents.

A group or group may also be referred to herein as "unsubstituted" or by equivalent terms such as "non-substituted," which refers to the original group in which a non-hydrogen moiety does not replace a hydrogen within that group.

As used herein, when a definition is not otherwise provided, the term "hetero" refers to a compound or group including one to three heteroatoms that are N, O, S, P, and/or Si.

As used herein, "Group" refers to a group of Periodic Table of the Elements.

As used herein, "Group II" refers to Group IIA and Group IIB, and examples of Group II metal may be Cd, Zn, Hg, and Mg, but are not limited thereto.

As used herein, examples of "Group II metal that does not include Cd" refers to a Group II metal except Cd, for example Zn, Hg, Mg, etc.

As used herein, "Group III" refers to Group IIIA and Group IIIB, and examples of Group III metal can be Al, In, Ga, and TI, but are not limited thereto.

As used herein, "Group IV" refers to Group IVA and Group IVB, and examples of a Group IV metal can be Si, Ge, and Sn, but are not limited thereto. As used herein, the term "metal" can include a semi-metal such as Si.

As used herein, "Group I" refers to Group IA and Group IB, and examples include Li, Na, K, Rb, and Cs, but are not limited thereto.

As used herein, "Group V" refers to Group VA, and examples include nitrogen, phosphorus, arsenic, antimony, and bismuth, but are not limited thereto.

As used herein, "Group VI" refers to Group VIA, and examples include sulfur, selenium, and tellurium, but are not limited thereto.

FIG. 1 is a schematic cross-sectional view of an electroluminescent device 10 according to an embodiment.

According to an embodiment, an electroluminescent device 10 includes a first electrode 110 and a second electrode 160 facing each other and an emission layer 140 disposed therebetween and including a plurality of quantum dots 141 and a first hole transporting material. The first hole transporting material may include an organic material having a substituted or unsubstituted C4 to C20 alkyl group attached to a backbone structure. A hole transport layer 130 including a second hole transporting material may be further disposed between the first electrode 110 and the emission layer 140. If desired, a hole injection layer 120 may be further disposed between the first electrode 110 and the hole transport layer 130. In addition, an electron transport layer 150 may be further disposed between the emission layer 140 and the second electrode 160.

In an embodiment, the electroluminescent device 10 has a stack structure wherein the hole injection layer 120, the hole transport layer 130, the emission layer 140 and the electron transport layer 150 are disposed in this order between the first electrode 110 and the second electrode 160 facing each other.

In an embodiment, the first electrode 110 may be directly connected to a driving power source so may function to flow current to the emission layer 140. The first electrode 110 may include a material having light transmittance in at least a visible light wavelength region, but is not limited thereto. The first electrode 110 may include a material having light transmittance in an infrared or ultraviolet (UV) wavelength region. For example, the first electrode 110 may be an optically transparent material.

In an embodiment, the first electrode 110 may include molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

However, the first electrode 110 according to an embodiment is not necessarily limited thereto but may include a material further having light transmittance with respect to light in an infrared or ultraviolet (UV) wavelength region or a semi-permeable material selectively transmitting light in a particular wavelength region and conduct a function of reflecting light in a visible light wavelength region and turning it back toward the second electrode 160.

Meanwhile, in an embodiment, the first electrode 110 may be disposed on the substrate 100 as shown in FIG. 1. The substrate 100 may be a transparent insulating substrate or may be made of a ductile material. The substrate 100 may include glass or a polymer material in a film having a glass transition temperature (Tg) of greater than about 150° C. For example, it includes a COC (cycloolefin copolymer) or COP (cycloolefin polymer) based material.

In an embodiment, the substrate 100 may support the hole injection layer 120, the hole transport layer 130, the emission layer 140, and the electron transport layer 150 disposed between the first electrode 110 and the second electrode 160. However, the substrate 100 of the electroluminescent device 10 according to an embodiment may not be disposed under the first electrode 110, but the substrate 100 may be disposed on the second electrode 160 or may be omitted, as needed.

The second electrode 160 includes an optically transparent material and may function as a light-transmitting electrode to transmit light generated in the emission layer 140. In an embodiment, the second electrode 160 may include at least one of silver (Ag), aluminum (Al), copper (Cu), gold (Au), and an alloy thereof, molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

However, the second electrode 160 according to an embodiment is not necessarily limited thereto, and may include a semi-permeable material selectively transmitting light in a particular wavelength region, and reflecting a portion of light in another visible light wavelength region back towards the first electrode 110.

When the second electrode 160 functions as a reflecting electrode, the first electrode 110 may be a light-transmitting electrode formed of a material capable of transmitting light in at least a visible light wavelength region or a semi-permeable electrode selectively transmitting light in a particular wavelength region.

Each of the first electrode 110 and the second electrode 160 may be formed by depositing a material for forming an electrode on the substrate 100 or an organic layer by a method such as sputtering.

On the other hand, as shown in FIG. 1, an electroluminescent device 10 according to an embodiment may have a conventional structure wherein the substrate 100 and each of constituent elements are disposed in the above-described stacking order.

However, the electroluminescent device 10 according to an embodiment is not necessarily limited thereto and may have various structures within a range of satisfying the aforementioned order of disposing each constituent element. For example, when the substrate 100 is disposed not beneath the first electrode 110 but on the second electrode 160, the electroluminescent device 10 may have an inverted structure.

The hole injection layer 120 may be disposed on, for example directly on, the first electrode 110. The hole injection layer 120 may supply holes into the emission layer 140 through the hole transport layer 130. However, the hole injection layer 120 is optional and may be omitted considering the thickness and the material of the hole transport layer 130.

The hole injection layer 120 may be formed of a p-type semiconductor material or a material doped with a p-type dopant. For example, the hole injection layer 120 may include a [poly(3,4-ethylenedioxythiophene)] (PEDOT) or derivative, a [poly(styrene sulfonate)] (PSS) or derivative, a poly(N-vinylcarbazole) (PVK) or derivative, a poly(phenylenevinylene) or derivative such as a poly(p-phenylenevinylene) (PPV) derivative, a poly((C1 to C6 alkyl) (meth)acrylate) or derivative, a poly(9,9-dioctylfluorene) or derivative, a poly(spiro-fluorene) or derivative, tris(4-carbazol-9-yl-phenyl)amine (TCTA), N,N'-diphenyl-N,N'-bis(3-methylphenyl)-(1,1'-biphenyl)-4,4'-diamine (TPD), N,N-di (naphthalen-1-yl)-N—N'-diphenyl-benzidine (NPB), tris(3-methylphenylphenylamino)-triphenylamine (m-MTDATA), poly[(9,9-dioctylfluorenyl-2,7-diyl-co(4,4'-(N-4-butylphenyl)diphenylamine] (TFB), poly(9,9-dioctylfluorene)-co-N, N-diphenyl-N,N-di-(p-butylphenyl)-1,4-diaminobenzene) (PFB), poly-TPD, a metal oxide such as NiO and MoO$_3$, or a combination thereof, but is not limited thereto.

The hole transport layer 130 may be disposed on the first electrode 110, for example on the first electrode 110 and the hole injection layer 120. The hole transport layer 130 may provide and transport holes into the emission layer 140. The hole transport layer 130 may be formed directly under the emission layer 140 and directly contacts the emission layer 140.

In an embodiment, the hole transport layer 130 includes a second hole transporting material. The second hole transporting material may be a p-type semiconductor material, or a material doped with a p-type dopant.

In an embodiment, the second hole transporting material included in the hole transport layer 130 may be a different material from the first hole transporting material of the emission layer 140 that will be described later. In an embodiment, the second hole transporting material may be a polymer, an oligomer, a metal oxide, or a combination thereof.

Examples of the second hole transporting material may be a poly(3,4-ethylenedioxythiophene) or derivative, a poly (styrene sulfonate) or derivative, a poly-N-vinylcarbazole or derivative, a poly(phenylene vinylene) or derivative such as a poly(para-phenylene vinylene), a poly(C1 to C6 alkyl) (meth)acrylate) or derivative, a poly(C6 to C40 arylamine) or derivative, a polyaniline or derivative, a polypyrrole or derivative, a poly(9,9-dioctylfluorene) or derivative, for example a poly[(9,9-dioctylfluorenyl-2,7-diyl-co(4,4'-(N-4-butylphenyl)diphenylamine] or a poly((9,9-dioctylfluorene)-co-N,N-diphenyl-N,N-di-(p-butylphenyl)-1,4-diaminobenzene), a poly(spiro-fluorene) derivative, a poly-(N,N'-diphenyl-N,N'-bis(3-methylphenyl)-(1,1'-biphenyl)-4,4'-diamine) or derivative, NiO, MoO$_3$, or a combination thereof, but are not limited thereof.

When the hole transport layer 130 is made of a polymer, an oligomer, a metal oxide, or a combination thereof as the second hole transporting material, life-span of the light emitting device may be increased, and turn-on voltages of the electroluminescent device 10 that are a working initiation voltages may be lowered. Particularly, when the second hole transporting material is selected from the above-mentioned materials, surface morphology of the hole transport layer 130 in direct contact with the emission layer 140 may be uniformly controlled compared with when the monomolecular hole transporting material is used. Accordingly, leakage paths of the holes moving from the hole transport layer 130 to the emission layer 140 can be minimized, so that leakage currents and driving voltages may be lowered.

For example, the hole transport layer 130 may be formed in a wet coating method such as spin coating and the like. For example, both of the hole transport layer 130 and the emission layer 140 may be formed in a wet coating method. In this way, the hole transport layer 130 and/or the emission layer 140 may be formed in a simple process.

In addition, in an embodiment, the hole transport layer 130 and the emission layer 140 may be made of materials having relatively different solubilities. For example, the hole transport layer 130 has improved solubility in an aromatic non-polar solvent, and the emission layer 140 has improved solubility in an aliphatic non-polar solvent. When the hole transport layer 130 is dissolved in the aromatic non-polar solvent, the emission layer 140 is dissolved in the aliphatic non-polar solvent, and then a solution process is performed, the emission layer 140 may be formed without surface damage of the previously formed hole transport layer 130.

For example, when a TFB polymer film is formed as the hole transport layer 130, a precursor solution including a TFB precursor polymer and an aromatic non-polar solvent (e.g., toluene, xylene, etc.) is spin-coated on the first electrode 110 or the hole injection layer 120, thermal treatment is performed in an inert gas atmosphere of $N_2$ or in a vacuum at a temperature of about 150° C. to about 180° C. for about 30 minutes to form a hole transport layer 130 made of TFB, and the emission layer 140 may be conveniently formed thereon using an aliphatic non-polar solvent (for example, octane, nonane, cyclohexane, or the like) using a solution process.

In this way, when the solvent selectivity of the hole transport layer 130 and the emission layer 140 is relatively different from each other, both of the hole transport layer 130 and the emission layer 140 may be formed using a solution process, and thus it is possible to perform the process conveniently and to minimize the damage of the surface of the hole transport layer 130 by the organic solvent or the like in the process of forming the subsequent emission layer 140 by different solvent selectivity.

The emission layer 140 may be disposed between the first and the second electrodes. The emission layer may be disposed on the hole transport layer 130. The emission layer may include the plurality of quantum dots 141 and the first hole transporting material.

The emission layer 140 (or the quantum dots) may be a site where electrons and holes transported by a current supplied from the first electrode 110 and the second electrode 160 are combined to generate excitons, and the generated excitons are transited from an exited state to a ground state to emit light in a wavelength corresponding to the size and/or the composition of the quantum dots 141. That is, the quantum dots 141 may endow the emission layer 140 with an electro-luminescence function. The quantum dots are configured to emit a first light upon excitation by light. The first light may be green light, red light, or blue light. The first light has a first maximum peak wavelength. The first maximum peak wavelength may be present in a range of a wavelength region that will be described below.

The quantum dots 141 have a discontinuous energy bandgap by the quantum confinement effect and incident light may be converted into light having a particular wavelength and then radiated by emission of light. Accordingly, the emission layer 140 including the quantum dots 141 may produce light having excellent color reproducibility and color purity.

The emission layer 140 may emit light in a predetermined wavelength region. In an embodiment, the emission layer may be configured to emit the same light as the first light when a voltage is applied thereon. The predetermined wavelength region can belong to a visible light region. The predetermined wavelength region or the first peak wavelength of the quantum dots may be in any of a first wavelength region of about 380 nm to about 488 nm, a second wavelength region of about 490 nm to about 510 nm, a third wavelength region of greater than 510 nm to equal to or less than 580 nm, a fourth wavelength region of about 582 nm to about 600 nm, and a fifth wavelength region of about 620 nm to about 680 nm. In an embodiment, the quantum dots may emit green light and the predetermined wavelength region or the first peak wavelength of the quantum dots may be present in a range of greater than or equal to 500 nm, greater than or equal to about 510 nm, or greater than or equal to about 520 nm and less than or equal to about 580 nm, less than or equal to about 570 nm, less than or equal to about 560 nm, less than or equal to about 550 nm, or less than or equal to about 540 nm. In an embodiment, the quantum dots may emit red light and the predetermined wavelength region or the first peak wavelength of the quantum dots may be present in a range of greater than or equal to 600 nm, greater than or equal to about 610 nm, greater than or equal to about 620 nm, or greater than or equal to about 625 nm and less than or equal to about 680 nm, less than or equal to about 670 nm, less than or equal to about 660 nm or greater than or equal to about 650 nm. In an embodiment, the quantum dots may emit blue light and the predetermined wavelength region or the first peak wavelength of the quantum dots may be present in a range of greater than or equal to 440 nm, greater than or equal to about 450 nm, greater than or equal to about 460 nm, or greater than or equal to about 465 nm and less than or equal to about 490 nm, less than or equal to about 480 nm, less than or equal to about 475 nm, or less than or equal to about 470 nm.

The emission layer may be configured to emit light on the voltage application without formation of triplet emitter. In an embodiment, the emission layer may not include a phosphorescence dopant such as an organic metal compound. Examples of the organic metal compound for the phosphorescence dopant may include an iridium containing organic metal compound, a platinum containing organic metal compound, or a combination thereof.

The emission layer may not include cadmium, lead, or a combination thereof.

In an embodiment, each of the quantum dots 141 according to an embodiment may include a Group II-VI compound, a Group III-V compound, a Group IV-VI compound, a Group IV element or compound, a Group I-III-VI compound, a Group I-II-IV-VI compound, or a combination thereof.

The quantum dots may have a core shell structure having a core including a first semiconductor nanocrystal and a shell disposed on the core, the shell including a second semiconductor nanocrystal having a different composition from the first semiconductor nanocrystal. The shell may include a metal chalcogenide. The quantum dots may include zinc and sulfur in the shell or an outermost layer of the shell.

The first semiconductor nanocrystal and the second semiconductor nanocrystal may include each independently a Group II-VI compound, a Group III-V compound, a Group IV-VI compound, a Group IV element or compound, a Group I-III-VI compound, a Group I-II-IV-VI compound, or a combination thereof. The first semiconductor nanocrystal may include zinc, indium, or a combination thereof. The quantum dots (or the first semiconductor nanocrystal) may include InP, InZnP, ZnSe, ZnSeTe, or a combination thereof. The quantum dots may include zinc.

The Group II-VI compound may be a binary element compound such as ZnS, ZnSe, ZnTe, ZnO, HgS, HgSe, HgTe, MgSe, MgS, or a combination thereof; a ternary element compound such as ZnSeS, ZnSeTe, ZnSTe, HgSeS, HgSeTe, HgSTe, HgZnS, HgZnSe, HgZnTe, MgZnSe, MgZnS, or a combination thereof; and a quaternary element compound such as HgZnTeS, HgZnSeS, HgZnSeTe, HgZnSTe, or a combination thereof. The Group II-VI compound may further include a Group III metal.

The Group III-V compound may be a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, InZnP, or a combination thereof; and a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof. The Group III-V compound may further include a Group II metal (e.g., InZnP).

The Group IV-VI compound may be a binary element compound such AsSnS, SnSe, SnTe, PbS, PbSe, PbTe, or a combination thereof; a ternary element compound such as SnSeS, SnSeTe, SnSTe, PbSeS, PbSeTe, PbSTe, SnPbS, SnPbSe, SnPbTe, or a combination thereof; and a quaternary element compound such as SnPbSSe, SnPbSeTe, SnPbSTe, or a combination thereof. Examples of the Group I-III-VI compound may be CuInSe$_2$, CuInS$_2$, CuInGaSe, and CuInGaS, are not limited thereto. Examples of the Group I-II-IV-VI compound may be CuZnSnSe and CuZnSnS, but are not limited thereto. Examples of the Group IV compound may be a single substance such as Si, Ge, or a combination thereof; and a binary element compound such as SiC, SiGe, or a combination thereof.

The binary element compound, the ternary element compound, or the quaternary element compound respectively can exist in a uniform concentration in the particle or in partially different concentrations in the same particle.

According to an embodiment, the quantum dots may have a core-shell structure including one semiconductor nanocrystal core particle and another semiconductor nanocrystal shell surrounding the core. The core and the shell may have a concentration gradient wherein the concentration of the element(s) of the shell decreases or increases in a direction towards the core. In addition, the quantum dots may have one semiconductor nanocrystal core and multiple shells surrounding the core. Herein, the multi-layered shell structure has a structure of two or more shells and each layer may have a single composition or an alloy and/or may have a concentration gradient.

When the quantum dot has a core-shell structure, a material composition of the shell has a larger energy bandgap than that of the core, which may exhibit an effective quantum confinement effect. However, the embodiment is not limited thereto. Meanwhile, in the multi-layered shell, a shell that is outside of the core may have a higher energy bandgap than a shell that is nearer to the core and quantum dots may have an ultraviolet (UV) to infrared wavelength emission ranges.

The quantum dots may have quantum efficiency of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 90%, about 100%, or even 100%.

In a display device, the quantum dots may have a relatively narrow spectrum so as to improve color purity or color reproducibility. The quantum dots may have for example a full width at half maximum (FWHM) at a photoluminescence wavelength spectrum of less than or equal to about 45 nm, less than or equal to about 40 nm, or less than or equal to or about 30 nm. Within the ranges, color purity or color reproducibility of a display device may be improved.

The quantum dots may have an average particle diameter (a diameter or an equivalent diameter measured/calculated from a (e.g., two dimensional) image obtained by an electron microscope) of about 1 nm to about 100 nm. For example, the quantum dots may have an average particle diameter of about 1 nm to about 20 nm, for example, about 2 nm (or about 3 nm) to about 20 nm (or about 15 nm, or about 10 nm, or about 9 nm).

In addition, the shapes of the quantum dots may be general shapes in this art and thus may not be particularly limited. For example, the quantum dots may have a spherical, oval, tetrahedral, pyramidal, cuboctahedral, cylindrical, polyhedral, multi-armed, or cube nanoparticle, nanotube, nanowire, nanofiber, nanosheet, or a combination thereof. The quantum dots may have any cross-sectional shape.

The quantum dots may be commercially available or may be synthesized in any method. For example, several nano-sized quantum dots may be synthesized according to a wet chemical process. In the wet chemical process, precursors react in an organic solvent to grow crystal particles, and the organic solvent or a ligand compound may coordinate the surface of the quantum dot, controlling the growth of the crystal. Examples of the organic solvent and the ligand compound are known.

An excess amount of an organic material that is not coordinated on (bound to) the surface of the nanocrystals may be removed by pouring it in excessive non-solvent, and centrifuging the resulting mixture. Examples of the non-solvent may be acetone, ethanol, methanol, and the like, but are not limited thereto. The quantum dots may include an organic material (e.g., (organic) ligand compound, an organic solvent, or a combination thereof) in an amount of less than or equal to about 50% by weight, for example, less than or equal to about 30 wt %, less than or equal to about 20 wt %, or less than or equal to about 10 wt % based on a weight of the quantum dots. The organic material may include a ligand compound, an organic solvent, or a combination thereof.

The electroluminescent device 10 according to an embodiment may further include a ligand (hereinafter, referred to as a hydrophobic ligand) having a hydrophobic moiety bound to the surface of the quantum dots 141. In an embodiment, the hydrophobic ligand may include a functional group bound to the surface of the quantum dots 141 and a hydrophobic functional group providing hydrophobicity.

The hydrophobic moiety may be for example a C4 to C20 alkyl group, a C4 to C20 alkenyl group, a C4 to C20 alkynyl group, or a combination thereof and the functional group bound to the surface of the quantum dots 141 may be for example a hydroxy group (—OH), a carboxyl group (—COOH), an amine group, a thiol group, a phosphine group, a phosphonic acid group, a phosphonic acid group, or the like.

Examples of the hydrophobic ligand may be fatty acid such as oleic acid, stearic acid, palmitic acid, and the like. The organic ligand may include $RCOOH$, $RNH_2$, $R_2NH$, $R_3N$, $RSH$, $R_3PO$, $R_3P$, $ROH$, $RCOOR$, $RPO(OH)_2$, $RHPOOH$, $R_2POOH$, or a combination thereof (wherein, R is each independently a C3 (or C5) to C40 substituted or unsubstituted aliphatic hydrocarbon group such as C3 to C40 alkyl, alkenyl, or alkynyl or the like, a C6 to C40 substituted or unsubstituted aromatic hydrocarbon group such as C6 to C40 aryl group, or a combination thereof).

Examples of the organic ligand may include a thiol compound such as methane thiol, ethane thiol, propane thiol, butane thiol, pentane thiol, hexane thiol, octane thiol, dodecane thiol, hexadecane thiol, octadecane thiol, or benzyl thiol; an amine compounds such as methylamine, ethylamine, propylamine, butane amine, pentylamine, hexylamine, octylamine, nonylamine, decylamine, dodecylamine, hexadecylamine, octadecylamine, dimethylamine, diethylamine, dipropylamine, tributylamine, or trioctylamine; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine compound such as methyl phosphine, ethyl phosphine, propyl phosphine, butyl phosphine, pentyl phosphine, octyl phosphine, dioctyl phosphine, tributyl phosphine, or trioctyl phosphine; an oxide of a phosphine compound such methyl phosphine oxide, ethyl phosphine oxide, propyl phosphine oxide, butyl phosphine oxide, pentyl phosphine oxide, tributyl phosphine oxide, octyl phosphine oxide, dioctyl phosphine oxide, or trioctyl phosphine oxide; a diphenyl or triphenyl phosphine compound, or an oxide compound thereof; a C5 to C20 alkyl phosphonic acid; a C5 to C20 alkyl phosphinic acid, such as hexyl phosphinic acid, octyl phosphinic acid, dodecane phosphinic acid, tetradecane phosphinic acid, hexadecane phosphinic acid, octadecane phosphinic acid; and the like, but are not limited thereto.

When the hydrophobic (organic) ligand is included as described, the quantum dots 141 may exhibit non-polarity (e.g., as a whole), and the emission layer 140 including the same may entirely exhibit non-polarity. The quantum dots 141 having the attached hydrophobic ligand may have solvent selectivity for a non-polar solvent, specifically an aliphatic non-polar solvent.

In an electroluminescent device 10 according to an embodiment, the emission layer 140 may include the quantum dots 141 in a small amount in order to exhibit excellent luminous efficiency.

The quantum dots 141 may be included in an amount of for example greater than or equal to about 5 wt %, greater than or equal to about 10 wt %, greater than or equal to about 15 wt %, or greater than or equal to about 20 wt %, greater than or equal to about 25 wt %, greater than or equal to about 30 wt %, greater than or equal to about 35 wt %, greater than or equal to about 40 wt %, greater than or equal to about 45 wt %, greater than or equal to about 50 wt %, greater than or equal to about 55 wt %, greater than or equal to about 60 wt %, greater than or equal to about 65 wt %, greater than or equal to about 70 wt %, greater than or equal to about 75 wt %, greater than or equal to about 80 wt %, greater than or equal to about 85 wt %, or greater than or equal to about 95 wt % and less than or equal to about 98 wt %, less than or equal to about 95 wt %, less than or equal to about 90 wt %, less than or equal to about 85 wt %, less than or equal to about 80 wt %, less than or equal to about 75 wt %, less than or equal to about 70 wt %, less than or equal to about 65 wt %, less than or equal to about 60 wt %, less than or equal to about 55 wt %, or less than or equal to about 50 wt %, based on 100 wt % of the emission layer, but is not limited thereto. In an embodiment, an amount of the quantum dots may be about 5 wt % to about 98 wt %, about 20 wt % to about 98 wt %, about 20 wt % to about 90 wt %, about 20 wt % to about 85 wt %, about 50 wt % to about 85 wt % based on 100 wt % of the emission layer.

The amount of the quantum dots 141 may be adjusted considering materials of the used quantum dots 141, a type of emitted light, an amount of a used organic ligand (e.g. hydrophobic ligand), and thicknesses of the hole transport layer 130, the emission layer 140 and/or the electron transport layer 150.

In a device of an embodiment, the emission layer may include the quantum dots and a first hole transporting material mixed therewith. The first hole transporting material may improve a hole transporting capability of the emission layer 140. The first hole transporting material may be a different material from the second hole transporting material of the hole transport layer 130. The first hole transporting material may be a p-type semiconductor material, or a material doped with a p-type dopant and may be selected from monomolecular to low molecular weight materials, or a combination thereof unlike the second hole transporting material.

A conventional, quantum dot based electroluminescent device may suffer a serious problem of deterioration of the emission layer. When the deterioration of the emission layer occurs, brightness of the device decreases, and an operating voltage thereof increases over the operation time. Without wishing to be bound by any theory, such deterioration may result from the following reasons:

In a quantum dot based emission layer, a hole mobility may be lower than an electron mobility and thus a hole-electron recombination tends to occur at or near a HTL(hole transport layer)/QD interface. Such an interfacial recombination may have an adverse effect on a lifetime of the device. When the hole injection into the QD emission layer is delayed (or not facilitated), the holes may be accumulated at the HTL/QD interface and deterioration of the interface may occur. The excess electrons injected into the QD emission layer may cause the deterioration of the HTL interface and/or even may cross the HTL to combine with the holes, forming an exciton that also causes additional deterioration of the HTL.

The deterioration of the HTL may cause an increase in an operation voltage of the device and further impede the hole injection, resulting in a reduction of a device efficiency and a decrease of a device luminance.

In addition, inefficient movements of the charges inside the quantum dot emission layer may bring forth a charge accumulation, which may in turn an increase of an E-Field applied inside the quantum dot and thereby the quantum efficiency of the quantum dot may be temporarily decreased by Stark effect.

In the electroluminescent device of an embodiment, a single molecular compound (e.g., the first hole transporting material) showing a relatively high hole mobility is mixed with the quantum dots in the emission layer. Without wishing to be bound by any theory, the introduction of the aforementioned emission layer may improve the hole injection property into the emission layer, whereby the HTL/QD interfacial deterioration may be suppressed and the charge accumulation, which may possibly occur in the emission layer otherwise, may be reduced and relieved. In addition, without wishing to be bound by any theory, it is believed that an energy transfer via exciton may occur between the first hole transporting layer and the quantum dots, which may bring forth additional improvement of a device performance.

Therefore, in the emission layer included in the device of an embodiment, the first hole transporting material is configured to emit a second light on excitation by light. The second light may have a second (maximum) peak wavelength. The second peak wavelength may be less than the first peak wavelength of the quantum dots. The difference between the second peak wavelength and the first peak wavelength may be at least about 10 nm, at least about 50 nm, at least about 100 nm, at least about 130 nm, at least about 150 nm, at least about 160 nm, at least about 170 nm, at least about 180 nm, at least about 190 nm, at least about 200 nm, at least about 210 nm, at least about 220 nm, at least about 230 nm, at least about 240 nm, at least about 250 nm, at least about 260 nm, at least about 270 nm, at least about 280 nm, or at least about 300 nm. The difference between the second peak wavelength and the first peak wavelength may be less than or equal to about 600 nm, less than or equal to about 500 nm, or less than or equal to about 400 nm.

In an embodiment, the first peak wavelength of the quantum dot is in a range of about 600 nm to about 650 nm (red emission), the second peak wavelength of the second light may be greater than or equal to about 380 nm, or greater than or equal to about 420 nm and less than or equal to about 590 nm, less than or equal to about 500 nm or less than or equal to about 490 nm.

In an embodiment, the first peak wavelength of the quantum dot is in a range of about 500 nm to about 560 nm (green emission), the second peak wavelength may be greater than or equal to about 300 nm, greater than or equal to about 330 nm, greater than or equal to about 380 nm, or greater than or equal to about 420 nm and less than or equal to about 490 nm, 480 nm, less than or equal to about 470 nm, or less than or equal to about 460 nm.

In an embodiment, the first peak wavelength of the quantum dot is in a range of about 440 nm to about 470 nm (blue emission), the second peak wavelength may be greater than or equal to about 300 nm, greater than or equal to about 330 nm, greater than or equal to about 380 nm, or greater than or equal to about 420 nm and less than about 470 nm, less than or equal to about 460 nm, less than or equal to about 450 nm, less than or equal to about 440 nm, less than or equal to about 430 nm, less than or equal to about 420 nm, less than or equal to about 410 nm, less than or equal to about 400 nm, less than or equal to about 390 nm, less than or equal to about 380 nm, less than or equal to about 370 nm, less than or equal to about 360 nm, or less than or equal to about 350 nm.

In an electroluminescent state of the device (e.g., upon the application of the voltage with no excitation light), the first hole transporting material may not emit light of the second peak wavelength. In an embodiment, the emission layer may be configured to emit light without the formation of a triplet emitter. Thus, the emission layer may emit light having substantially the same color as the first light of the quantum dots.

The electroluminescent emission layer may include at least two emission layers that are optically isolated with each other and repeating (e.g. arranged in a predetermined pattern) such as a first repeating emission layer, a second repeating emission layer, or the like and each of the repeating emission layer may be configured to emit light of a desired color.

The quantum dots in the emission layer (e.g., in an individual emission layer) may be configured to emit light of the same color. As used herein, "emission of light of the same color" may refer to the case where a difference between the (maximum) peak wavelengths thereof may be less than or equal to about 30 nm, for example, less than or equal to about 20 nm, less than or equal to about 15 nm, less than or equal to about 10 nm, or less than or equal to about 5 nm, In the device of the embodiment, a full width at half maximum of the light emitted from the emission layer (or the electroluminescent peak thereof) may be less than or equal to about 60 nm, less than or equal to about 50 nm, less than or equal to about 40 nm, less than or equal to about 35 nm, less than or equal to about 30 nm, or less than or equal to about 25 nm or less than or equal to about 20 nm.

In an embodiment, the time resolved photoluminescence (TRPL) is used to determine a temporal evolution and a corresponding radiative lifetime with respect to an emitted light (e.g., the first light or the second light) having a predetermined wavelength. An apparatus for the TRPL analysis is commercially available. The luminescence data may be fit with a multi-exponential decay of the form:

$$I(t) = \sum_{i=1}^{N} a_i e^{-t/\tau_i}$$

convolved with the instrument response function, where t is time, I(t) is an intensity at the time t, $t_i$ and $a_i$ correspond to the lifetime and the fractional contribution of each component to the decay, respectively.

In an embodiment, the first hole transporting material may be well fit by a one-term exponential composed of a fast initial decay. In an embodiment, the quantum dots of the emission layer may be well fit by a three-term exponential composed of a fast initial decay (t1), followed by a moderate decay (t2), in addition to a longer lived component (t3), and the decay time at each component is denoted as t1, t2, and t3, respectively. An average decay time ($t_{avg}$) is a weighted average of the decay times of the components.

In the TRPL analysis, the emission layer including the aforementioned combination of the quantum dots and the first hole transporting material may show a t1 for the first light that is less than or equal to about 15 ns, less than or equal to about 14 ns, less than or equal to about 13 ns, less than or equal to about 12 ns, less than or equal to about 11 ns, less than or equal to about 10 ns, or less than or equal to about 9 ns. For example, the t1 for the first light may be in a range of from about 1 ns to about 15 ns, from about 2 ns to about 14 ns, from about 3 ns to about 13 ns, from about 4 ns to about 12 ns, from about 5 ns to about 11 ns, from about 6 ns to about 10 ns, from about 7 ns to about 9 ns, or a combination thereof.

In the TRPL analysis of the emission layer, a decay fraction of the t1 for the first light may be greater than or equal to about 5%, greater than or equal to about 10%, greater than or equal to about 15%, greater than or equal to about 20%, or greater than or equal to about 25%. For example, the decay fraction of the t1 for the first light may be in a range of from about 5% to about 40%, from about 10% to about 35%, from about 15% to about 30%, from about 20% to about 25%, or a combination thereof.

In the case of a emission layer that includes the quantum dot but does not include the foregoing first hole transporting material, at the TRPL analysis for the first light, the decay component (fraction) for the t1 may not present (e.g., may be zero %) or if present may be less than or equal to about 5%, or less than about 1%. However, when the emission layer includes the foregoing hole transporting material together with the quantum dots, the quantum dots included in the emission layer may exhibit the fraction of the fast initial decay (t1), which indicates that a decay path for the exciton formed in the emission layer may be changed.

In the TRPL analysis of the emission layer, an average decay time ($t_{avg}$) for the first light of the quantum dots may be less than or equal to about 30 ns, less than or equal to about 29 ns, less than or equal to about 28 ns, less than or equal to about 27 ns, or less than or equal to about 26 ns. The average decay time ($t_{avg}$) for the first light of the quantum dots may be greater than or equal to about 10 ns, greater than or equal to about 15 ns, or greater than or equal to about 20 ns.

In the TRPL analysis of the emission layer, an average decay time ($t_{avg}$) for the second light of the first hole transporting material may be less than or equal to about 0.7 ns, less than or equal to about 0.6 ns, less than or equal to about 0.5 ns, less than or equal to about 0.4 ns, or less than or equal to about 0.3 ns. In the TRPL analysis of the emission layer, an average decay time ($t_{avg}$) for the second light of the first hole transporting material may be greater than or equal to about 0.1 ns, greater than or equal to about 0.2 ns, greater than or equal to about 0.3 ns, greater than or equal to about 0.4 ns, or greater than or equal to about 0.5 ns.

The emission layer of the embodiment includes the quantum dots together with the first hole transporting material and an excitation wavelength dependent photoluminescent behavior thereof includes not only the emission of the quantum dots but also the emission with which the quantum dots and the hole transporting material are related together and thus is different from a emission layer including only the quantum dots.

In an excitation wavelength dependent photoluminescence emission behavior analysis (hereinafter, a PLE analysis), a light emitting intensity of the emission layer may be less than or equal to about 0.4, less than or equal to about 0.35, less than or equal to about 0.2, or less than or equal to about 0.15 with respect to a maximum intensity when it is excited with light of a wavelength of the second peak wavelength. In the PLE analysis, a light emitting intensity of the emission layer may be less than or equal to about 0.4, less than or equal to about 0.3, less than or equal to about 0.2, less than or equal to about 0.15, or less than or equal to about 0.1 with respect to its maximum intensity when it is excited with light of a wavelength of 450 nm.

In an embodiment, the first hole transporting material may have a substituted or unsubstituted C4 to C20 alkyl group attached to a backbone structure. The first hole transporting material may have an enhanced solubility with respect to a non-polar solvent, specifically an aliphatic non-polar solvent.

In an embodiment, both of the first hole transporting material and the hydrophobic ligand may have solubility in an aliphatic non-polar solvent. Accordingly, when the emission layer 140 is formed using the solution, the formed emission layer 140 may have improved surface morphology and may have excellent hole transporting capability due to the first hole transporting material.

As described, the emission layer 140 and the hole transport layer 130 have solubility in an aliphatic non-polar solvent or an aromatic non-polar solvent, and thus damages to the surface of the hole transport layer 130 may be minimized during the formation of the emission layer 140 and thus the hole transport layer 130 may maintain excellent hole transporting capability.

In an embodiment, the first hole transporting material may have a substituted or unsubstituted C4 to C20 alkyl group attached to a backbone structure. When the first hole transporting material has a substituted or unsubstituted C4 to C20 alkyl group attached to a backbone structure, the first hole transporting material may be dissolved in a non-polar solvent, specifically an aliphatic non-polar solvent.

In an embodiment, the first hole transporting material may be a compound represented by Chemical Formula 1.

Chemical Formula 1

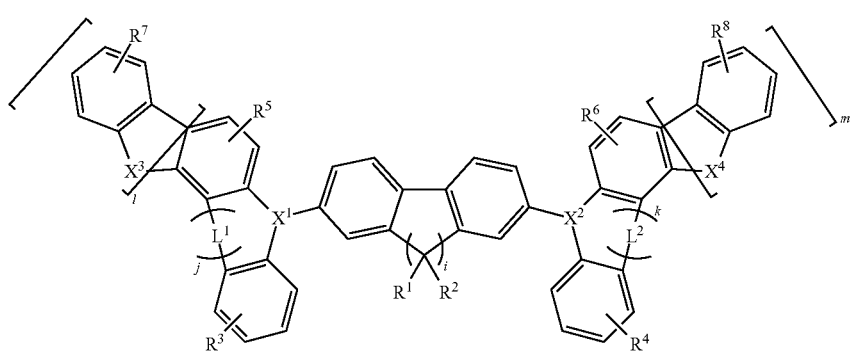

In Chemical Formula 1,
$R^1$ to $R^8$ are each independently hydrogen, a C1 to C3 alkyl group, a substituted or unsubstituted C4 to C20 alkyl group, a substituted or unsubstituted C3 to C20 cycloalkyl group, a substituted or unsubstituted C6 to C20 aryl group, a substituted or unsubstituted C3 to C20 heteroaryl group, a substituted or unsubstituted C2 to C40 alkylamine group, or a substituted or unsubstituted C6 to C40 arylamine group, provided that at least one of $R^1$ to $R^8$ is a substituted or unsubstituted C4 to C20 alkyl group, and if any of $R^3$ to $R^8$ is a substituted or unsubstituted C3 to C20 cycloalkyl group, a substituted or unsubstituted C6 to C20 aryl group, or a substituted or unsubstituted C3 to C20 heteroaryl group, it may be each independently fused with an adjacent aromatic ring to provide a C8 to C15 fused ring, $X^1$ and $X^2$ are independently selected from N and C(—$R^a$), and $X^3$ and $X^4$ are independently selected from S, N—$R^b$, and C(—$R^c$)(—$R^d$), wherein $R^a$, $R^b$, $R^c$, and $R^d$ are independently selected from hydrogen, a substituted or unsubstituted C1 to C20 alkyl group, a substituted or unsubstituted C3 to C20 cycloalkyl group, a substituted or unsubstituted C6 to C20 aryl group, and a substituted or unsubstituted C3 to C20 heteroaryl group, $L^1$ and $L^2$ are independently selected from a single bond and a substituted or unsubstituted methylene group or C2 to C4 alkenylene group, and i, j, k, l, and m are independently 0 or 1. When i, j, k, l, or m is 0, the corresponding moiety represented by it is not present. For example, when j is 0,

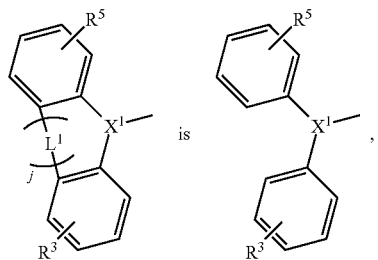

is

, and when i is 0,

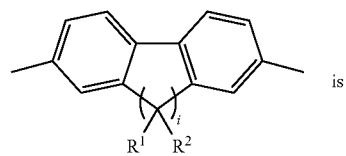

is

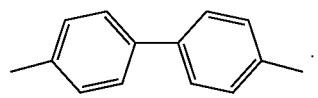

.

Since the first hole transporting material includes a compound having a relatively small molecular weight as shown in Chemical Formula 1 and is well mixed with the ligands on the surface of the quantum dots, the emission layer 140 may exhibit improved surface morphology compared with when the quantum dots are included alone and/or the quantum dots and the polymeric/oligomeric hole transporting material are included.

Specifically, the first hole transporting material may include a compound represented by Chemical Formula 2.

Chemical Formula 2

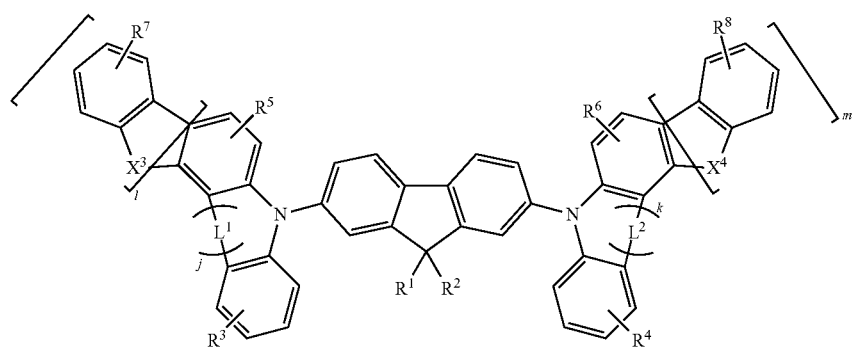

wherein, in Chemical Formula 2, $X^3$, $X^4$, $L^1$, $L^2$, j, k, l, and m are the same as defined in Chemical Formula 1, $R^1$ to $R^8$ are each independently hydrogen, a C1 to C3 alkyl group, a substituted or unsubstituted C4 to C20 alkyl group, a substituted or unsubstituted C3 to C20 cycloalkyl group, a substituted or unsubstituted C6 to C20 aryl group, a substituted or unsubstituted C3 to C20 heteroaryl group, a substituted or unsubstituted C2 to C40 alkylamine group, or a substituted or unsubstituted C6 to C40 arylamine group, provided that at least one of $R^1$ to $R^6$ is a substituted or unsubstituted C4 to C20 alkyl group, and If any of $R^3$ to $R^6$ is one of a substituted or unsubstituted C3 to C20 cycloalkyl group, a substituted or unsubstituted C6 to C20 aryl group, or a substituted or unsubstituted C3 to C20 heteroaryl group, it may be each independently fused with an adjacent aromatic ring to provide a C8 to C40 fused ring.

In Chemical Formula 2, at least two of $R^1$ to $R^6$ may be a substituted or unsubstituted C4 to C20 alkyl group. In this case, the solubility of the first hole transporting material in the aliphatic non-polar solvent may be further improved.

For example, the first hole transporting material may include at least one of compounds represented by Chemical Formula 2-1 to Chemical Formula 2-2.

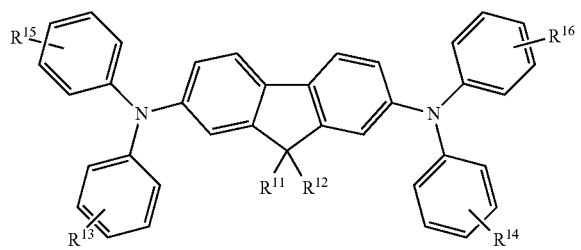

Chemical Formula 2-1

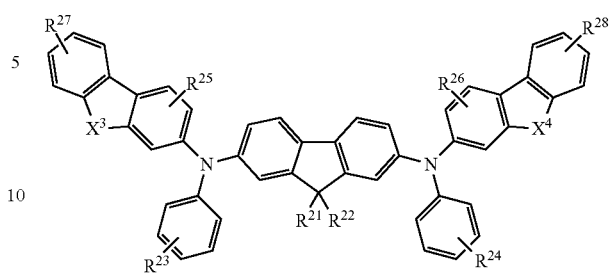

Chemical Formula 2-2

In Chemical Formula 2-1 to Chemical Formula 2-2, $X^3$ and $X^4$ are the same as defined in Chemical Formula 1, $R^{11}$, $R^{12}$, $R^{13}$, $R^{14}$, $R^{15}$, $R^{16}$, $R^{21}$, $R^{22}$, $R^{23}$, $R^{24}$, $R^{25}$, and $R^{26}$ are each independently hydrogen, a C1 to C3 alkyl group, a substituted or unsubstituted C4 to is C20 alkyl group, a substituted or unsubstituted C3 to C20 cycloalkyl group, a substituted or unsubstituted C6 to C20 aryl group, or a substituted or unsubstituted C3 to C20 heteroaryl group, provided that at least one of $R^{11}$ to $R^{14}$ and at least one of $R^{21}$ to $R^{26}$ are a substituted or unsubstituted C4 to C20 alkyl group, $R^{27}$ and $R^{28}$ are independently a substituted or unsubstituted C2 to C40 alkylamine group, a substituted or unsubstituted C6 to C40 arylamine group, or a substituted or unsubstituted carbazolyl group, and when any of $R^{13}$, $R^{14}$, $R^{15}$, $R^{16}$, $R^{23}$, $R^{24}$, $R^{25}$, and $R^{26}$ is one of a substituted or unsubstituted C3 to C20 cycloalkyl group, a substituted or unsubstituted C6 to C20 aryl group, or a substituted or unsubstituted C3 to C20 heteroaryl group, it may be each independently fused with an adjacent aromatic ring to provide a C8 to C40 fused ring.

On the other hand, the first hole transporting material may include a compound represented by Chemical Formula 3.

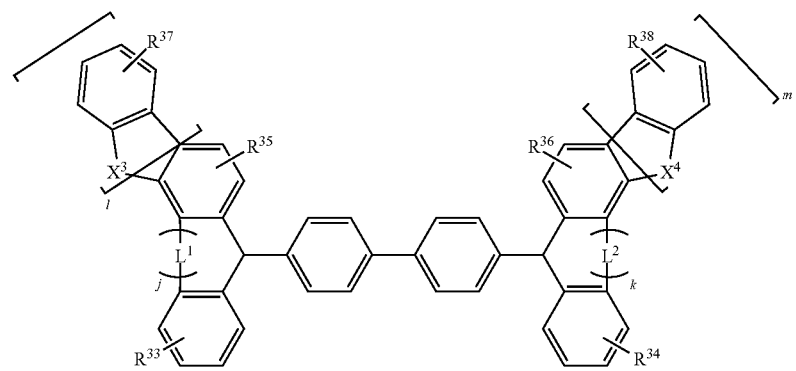

Chemical Formula 3

In Chemical Formula 3, $X^3$, $X^4$, $L^1$, $L^2$, j, k, l, and m are independently the same as defined in Chemical Formula 1, and $R^{33}$, $R^{34}$, $R^{35}$, $R^{36}$, $R^{37}$, and $R^{38}$ are each independently hydrogen, a C1 to C3 alkyl group, a substituted or unsubstituted C4 to C20 alkyl group, a substituted or unsubstituted C3 to C20 cycloalkyl group, a substituted or unsubstituted C6 to C20 aryl group, a substituted or unsubstituted C3 to C20 heteroaryl group, a substituted or unsubstituted C2 to C40 alkylamine group, or a substituted or unsubstituted C6 to C40 arylamine group, provided that at least one of $R^{33}$ to $R^{38}$ is a substituted or unsubstituted C4 to C20 alkyl group, and when any of $R^{33}$, $R^{34}$, $R^{35}$, $R^{36}$, $R^{37}$, and $R^{38}$ is one of a substituted or unsubstituted C3 to C20 cycloalkyl group, a substituted or unsubstituted C6 to C20 aryl group, or a substituted or unsubstituted C3 to C20 heteroaryl group, it may be each independently fused with an adjacent aromatic ring to provide a C8 to C40 fused ring.

In Chemical Formula 3, at least two of $R^{33}$ to $R^{36}$ may be an unsubstituted C4 to C10 linear or branched alkyl group. In this case, the solubility of the first hole transporting material in the aliphatic non-polar solvent may be further improved.

More specifically, the first hole transporting material may include at least one of compounds represented by Chemical Formula A to Chemical Formula F.

Chemical Formula A

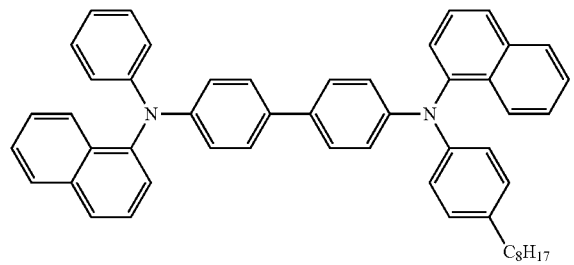

Chemical Formula B

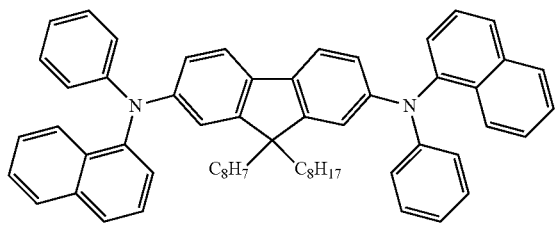

Chemical Formula C

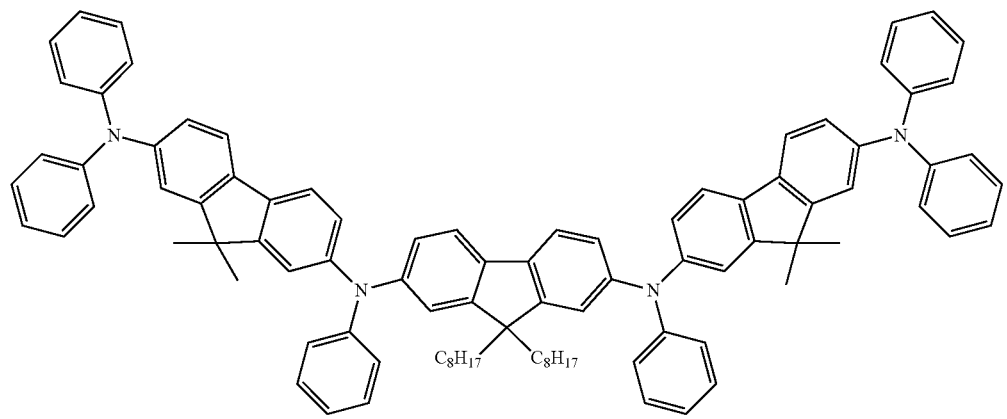

Chemical Formula D

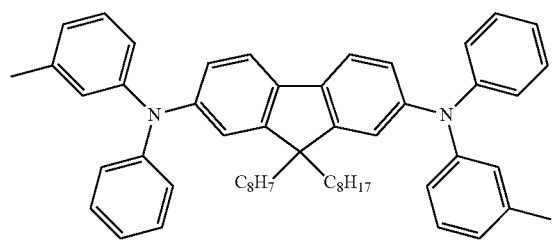

Chemical Formula E

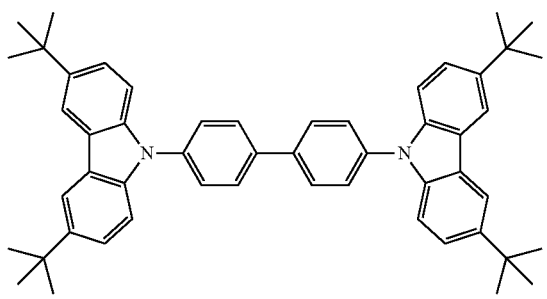

-continued

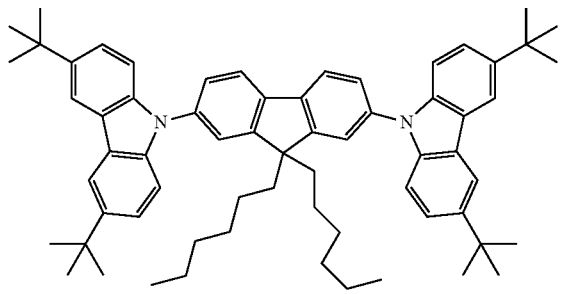

Chemical Formula F

Hole transporting materials widely used in electroluminescent devices using quantum dots have a slower hole mobility than electron transporting materials. In order to secure stability, such as the life-span of the quantum dots, an organic ligand is bound to the surface of the quantum dots, and the organic ligand attached to the surface of the quantum dot generally has a very low hole mobility.

Therefore, at the time of driving the electroluminescent device, electrons and holes may not encounter each other at the center of the emission layer but on the interface with the hole transporting layer or the hole transporting layer. In this case, the quantum efficiency of the light emitting layer or the lifetime of the device may be significantly lowered, and therefore, it is necessary to set the electron/hole carrier balance in the electroluminescent device to an appropriate level.

Accordingly, a method of forming an emission layer by blending quantum dots with conventional hole transporting materials have been considered. However, since the conventional hole transport materials generally use higher molecular weight materials such as polymers/oligomers, surface morphology may not be uniformly formed when they are blended with quantum dots. If the surface morphology of the emission layer is uneven, cracks, pores, and the like may be generated on the surface of the emission layer. Since the cracks and/or pores act as leakage paths of holes and electrons, leakage currents and turn-on voltages may be increased as the surface morphology becomes uneven and life-span of a device may be largely deteriorated.

Further, when spin coating a composition obtained by blending quantum dots with conventional hole transporting materials, the composition may not be formed into a uniform thin film and may be pushed out, so that a emission layer may not be formed.

On the other hand, the electroluminescent device 10 according to an embodiment includes the emission layer 140 including the plurality of quantum dots 141 bound to the hydrophobic ligands and the low molecular weight to monomolecular first hole transporting material represented by Chemical Formula 1.

As described above, the emission layer 140 composed of the blend of the quantum dots 141 and the low molecular weight to monomolecular first hole transporting material has a superior surface morphology in comparison with a blend of a conventional blend of hole transporting material and quantum dots. Thus, cracks and/or pores on the surface of the emission layer are minimized, thereby reducing the leakage current and the turn-on voltage, and significantly improving a life-span of the device.

In addition, the emission layer 140 composed of the blend of the quantum dots 141 and the low molecular to monomolecular first hole transporting material is easily formed into a uniform thin film using a solution process such as spin coating.

Meanwhile, the electroluminescent device 10 according to an embodiment may be designed such that the emission layer 140 and the hole transport layer 130 have relatively different solvent selectivity. Accordingly, damage to the surface of the hole transport layer 130 may be minimized during the formation of the emission layer 140, which further reduces the leakage current and the turn-on voltage.

In addition, since the first hole transporting material is included in the emission layer 140, hole injection into the emission layer 140 is facilitated, so that the turn-on of the electroluminescent device 10 may be accelerated, hole carrier injected into the emission layer 140 may be easily adjusted, and the electric field voltage applied to the emission 140 may be lowered to improve luminous efficiency, maximum luminance and life-span.

In an embodiment, an amount of the first hole transport material in the emission layer 140 may be controlled considering a desired degree of hole/electron transportability of the hole transport layer 130 and the electron transport layer 150, whereby effectively controlling the hole/electron carrier balance in the emission layer 140.

In an embodiment, the first hole transporting material may be for example included in an amount of greater than or equal to about 2 wt %, greater than or equal to about 5 wt %, greater than or equal to about 10 wt %, greater than or equal to about 15 wt %, greater than or equal to about 20 wt %, greater than or equal to about 25 wt %, or greater than or equal to about 30 wt % and less than about 50 wt %, for example less than or equal to about 49 wt %, less than or equal to about 45 wt %, less than or equal to about 40 wt %, less than or equal to about 30 wt %, or less than or equal to about 25 wt % based on a total weight of the emission layer 140. In an embodiment, the first hole transporting material may be included in an amount of greater than or equal to about 2 wt % and less than about 50 wt %, for example greater than or equal to about 5 wt % and less than about 45 wt %, about 5 wt % to about 40 wt %, about 5 wt % to about 30 wt %, about 5 wt % to about 20 wt % based on a total weight of the emission layer 140.

When the first hole transporting material is included in the emission layer 140 within the above-described range, overall luminous efficiency and life-span characteristics of the electroluminescent device 10 may be greatly improved.

The surface morphology of the emission layer 140 according to an embodiment may be confirmed by using atomic force microscopy (AFM). In an embodiment, a root mean square roughness of the emission layer 140 measured by the atomic-force microscopy (AFM) may be for example greater than or equal to about 0.1 nm (in rms), greater than or equal to about 0.2 nm, greater than or equal to about 0.3 nm, greater than or equal to about 0.4 nm, greater than or equal to about 0.5 nm, greater than or equal to about 0.6 nm, greater than or equal to about 0.7 nm, greater than or equal to about 0.8 nm, or greater than or equal to about 0.9 nm, and for example less than or equal to about 2.0 nm, or less than or equal to about 1.5 nm, or for example about 0.5 nm to about 2.0 nm, or about 0.8 nm to about 1.5 nm.

That is, when the electroluminescent device 10 according to an embodiment forms the emission layer 140 by blending the quantum dots 140 and the first hole transporting material, the emission layer 140 may have excellent surface morphology as described above.

However, the method of confirming the surface morphology of the light emitting layer 140 in the electroluminescent device 10 according to an embodiment is not limited to the above-described measuring method. For example, the surface morphology may be measured by using other measurement methods such as a Zygo interferometer for an emission layer including the quantum dots and hole transporting material. In this case, a root mean square roughness range different from the above may be obtained. However, if the root mean square roughness measured by the measuring method according to an embodiment satisfies the above range, the emission layer falls within the scope of the present disclosure.

In an embodiment, a thickness of the emission layer 140 may be selected considering a material used in each of the layers, each electron/hole mobility, and a thickness of the hole transport layer 130, or the electron transport layer 150. The emission layer 140 may have a thickness (an average thickness) of about 15 nm to about 100 nm, about 20 nm to about 60 nm, about 20 nm to about 50 nm, about 20 nm to about 40 nm, or about 25 nm to about 30 nm. The thickness of the emission layer 140 according to an embodiment may be adjusted considering a relationship between the materials and/or a thickness of other components. In an embodiment, the thickness of the emission layer 140 may be less than or equal to about 60 nm so as to minimize a field-induced quenching, as a measure of reducing a turn-on voltage and an electric field of the emission layer, in consideration of luminous efficiency of the emission layer 140.

Adopting a thickness of the emission layer within the aforementioned range may avoid formation of voids, cracks, and the like, which may be present otherwise in the emission layer 140 to act as leakage paths of electrons/holes, making it possible for the carrier balance with other constituent elements of the electroluminescent device to be readily matched.

In addition, within the aforementioned range of a thickness, it becomes possible to readily match the electron/hole carrier balance and to achieve desired current and voltage conditions required for driving and efficient light emission.

Adopting the emission layer of the embodiment may makes it possible for electrons and holes to be effectively injected into the emission layer 140 and to be recombined inside the emission layer 140 rather than on an interface between the emission layer 140 and the hole transport layer 130, whereby the device may be operated without substantial interface light emission, and an undesired charge movement into the hole injection layer 120 and/or the hole transport layer 150 and a quenching caused thereby may suppressed.

In addition, the electroluminescent device 10 according to an embodiment may exhibit an improved transporting capability of the emission layer 140 and an improved hole transport/injection capability through the first hole transport material included in the emission layer 140 in the device. As a result, it becomes easier to match the hole/electron carrier balance in the device.

Accordingly, the electroluminescent device of the embodiment may have a maximum external quantum efficiency (max EQE) of greater than or equal to about 10%, greater than or equal to about 12%, greater than or equal to about 14%, or greater than or equal to about 16%. The electroluminescent device of the embodiment may have a maximum luminance of greater than or equal to about 50,000 cd/m$^2$ greater than or equal to about 55,000 cd/m$^2$, greater than or equal to about 60,000 cd/m$^2$, greater than or equal to about 65,000 cd/m$^2$, greater than or equal to about 70,000 cd/m$^2$, greater than or equal to about 75,000 cd/m$^2$, greater than or equal to about 80,000 cd/m$^2$, greater than or equal to about 85,000 cd/m$^2$, greater than or equal to about 90,000 cd/m$^2$, greater than or equal to about 95,000 cd/m$^2$, greater than or equal to about 100,000 cd/m$^2$, greater than or equal to about 105,000 cd/m$^2$, greater than or equal to about 110,000 cd/m$^2$, greater than or equal to about 115,000 cd/m$^2$, or greater than or equal to about 120,000 cd/m$^2$.

The electroluminescent device of the embodiment may have a T95 (or T90 or T80) of greater than or equal to about 100 hours, greater than or equal to about 150 hours, greater than or equal to about 200 hours, greater than or equal to about 250 hours, greater than or equal to about 300 hours, greater than or equal to about 400 hours, greater than or equal to about 450 hours, greater than or equal to about 500 hours, greater than or equal to about 550 hours, greater than or equal to about 600 hours, greater than or equal to about 650 hours, at the operation of 1500 nit. When an AC voltage is applied, the electroluminescent device of the embodiment may have a maximum capacitance of greater than or equal to about 0.8 nF, greater than or equal to about 1 nF, and/or less than or equal to about 50 nF (e.g., at 100 Hz).

The electroluminescent device of an embodiment may further include an electron transport layer 150 disposed between the emission layer 140 and the second electrode 160, transporting electrons into the emission layer 140.

In an embodiment, an average thickness of the electron transport layer 150 may be variously changed considering charge carrier balance of the hole injection layer 120, the hole transport layer 130, and/or the emission layer 140 in the device, but may be for example greater than or equal to about 20 nm, greater than or equal to about 30 nm, greater than or equal to about 40 nm, or greater than or equal to about 50 nm, and for example less than or equal to about 100 nm, less than or equal to about 90 nm, less than or equal to about 80 nm, less than or equal to about 70 nm, or less than or equal to about 60 nm, for example about 20 nm to about 100 nm, about 20 nm to about 90 nm, about 30 nm to about 80 nm, about 40 mm to about 80 nm, or about 60 nm to about 80 nm.

The emission layer of the embodiment may not include an electron transporting material that will be described below.

In an embodiment, the electron transport layer 150 may include a non light-emissive electron transporting materials, and it does not emit light on the application of an electric field and the electrons may not be quenched internally.

The electron transport layer 150 may include inorganic material nanoparticles or may be an organic layer formed by deposition. For example, the electron transport layer 150 may include inorganic nanoparticles, quinolone compounds, triazine compounds, quinoline compounds, triazole compounds, naphthalene compounds, or a combination thereof.

In an embodiment, the electron transport layer 150 may include inorganic nanoparticles 151. The inorganic nanoparticles 151 impart an electron transporting property to the electron transport layer 150 and do not exhibit luminescent properties. In an embodiment, the electron transport layer 150 may include at least two inorganic nanoparticles 151. In an embodiment, the electron transport layer 150 may include a cluster layer composed of at least two inorganic nanoparticles 151.

The inorganic nanoparticles may include a compound including a zinc metal oxide represented by $Zn_{1-x}M_xO$ (wherein M is Mg, Ca, Zr, W, Li, Ti, Y, Al, or a combination thereof, and $0 \leq x \leq 0.5$). in an embodiment, M may be Mg and the x may be greater than or equal to about 0.01 and less than or equal to about 0.3, for example, less than or equal to about 0.25, less than or equal to about 0.2, or less than or equal to about 0.15.

The inorganic nanoparticles may include a zinc oxide, a zinc magnesium oxide, or a combination thereof. An average size of the nanoparticle may be greater than or equal to about 1 nm, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm. The nanoparticle may not have a rod shape. The nanoparticle may not have a nanowire shape. An electron injection layer facilitating injection of electrons and/or a hole blocking layer blocking movement of holes may be further disposed between the electron transport layer 150 and the second electrode 160.

The electron injection layer and the hole blocking layer may have each desirably selected thickness. For example, each thickness may be in a range of greater than or equal to about 1 nm and less than or equal to about 500 nm but is not limited thereto. The electron injection layer may be an organic layer formed through deposition.

The electron injection layer may include for example at least one of 1,4,5,8-naphthalene-tetracarboxylic dianhydride (NTCDA), bathocuproine (BCP), tris[3-(3-pyridyl)-mesityl] borane (3TPYMB), LiF, $Alq_3$, $Gaq_3$, $Inq_3$, $Znq_2$, $Zn(BTZ)_2$, $BeBq_2$, ET204 (8-(4-(4,6-di(naphthalen-2-yl)-1,3,5-triazin-2-yl)phenyl)quinolone), 8-hydroxyquinolinato lithium (Liq), n-type metal oxide (e.g., ZnO, $HfO_2$, etc.), ET204 (8-(4-(4,6-di(naphthalen-2-yl)-1,3,5-triazin-2-yl)phenyl) quinolone), Bphen, ABH113, NET218, NET338, NDN77, NDN87, or a combination thereof, but is not limited thereto.

The hole blocking layer (HBL) may include for example at least one of 1,4,5,8-naphthalene-tetracarboxylic dianhydride (NTCDA), bathocuproine (BCP), tris[3-(3-pyridyl)-mesityl] borane (3TPYMB), LiF, $Alq_3$, $Gaq_3$, $Inq_3$, $Znq_2$, $Zn(BTZ)_2$, $BeBq_2$, or a combination thereof, but is not limited thereto.

As described above, the electroluminescent device 10 according to an embodiment may improve hole mobility of the emission layer 140 by including the quantum dots and the first hole transporting material in the emission layer 140. In addition, the first hole transporting material in the emission layer is a monomolecular to low molecular weight material having a substituted or unsubstituted C4 to C20 alkyl group attached to a backbone structure, and thus a solubility in a non-polar solvent is improved and the formed emission layer may have improved surface morphology when the light emitting layer comprising the plurality of quantum dots and the first hole transporting material are formed using a solution process.

In addition, according to an embodiment, the emission layer 140 and the hole transport layer 130 may be controlled to have solvent selectivity as described above. Accordingly, because the surface of the hole transport layer 130 is not damaged, the emission layer 140 and the hole transport layer 130 may maintain excellent hole transporting capability.

In addition, since the first hole transporting material included in the emission layer 140 has a substituted or unsubstituted C4 to C20 alkyl group attached to a backbone structure, it may be dissolved in the aliphatic non-polar solvent together with quantum dots on which hydrophobic ligands are attached. Accordingly, when the emission layer 140 is formed using the solution, surface morphology of the formed emission layer 140 is improved and hole transporting capability is improved due to the first hole transporting material. As a result, since hole transporting capability of the emission layer 140 itself is improved and conductivity of the emission layer 140 is also improved, quenching caused by an electric field of the emission layer 140 may be decreased and thus luminous efficiency, luminance, and life-span of the electroluminescent device 10 may be largely improved.

Hereinafter, a display device including the electroluminescent device 10 is described.

A display device according to an embodiment includes a substrate, a driving circuit formed on the substrate, and a first electroluminescent device, a second electroluminescent device, and a third electroluminescent device spaced apart from each other in a predetermined interval and disposed on the driving circuit.

The first to third electroluminescent devices have the same structure as the electroluminescent device 10 and but the wavelengths of the lights emitted from each quantum dots may be different from each other.

In an embodiment, the first electroluminescent device is a red device emitting red light, the second electroluminescent device is a green device emitting green light, and the third electroluminescent device is a blue device emitting blue light. In other words, the first to third electroluminescent devices may be pixels expressing red, green, and blue, respectively, in the display device.

However, an embodiment is not necessarily limited thereto, but the first to third electroluminescent devices may respectively express magenta, yellow, cyan, or may express other colors.

One of the first to third electroluminescent devices may be the electroluminescent device 10. In this case, the third electroluminescent device displaying at least blue may be desirably the electroluminescent device 10.

In the display device according to an embodiment, a hole injection layer, a hole transport layer, an electron transport layer, an electron injection layer, and a hole blocking layer except an emission layer of each pixel may be integrated to form a common layer. However, an embodiment is not limited thereto. A hole injection layer, a hole transport layer, an electron transport layer, an electron injection layer, and a hole blocking layer may be independently formed in each pixel of the display device, or at least one of a hole injection layer, a hole transport layer, an electron transport layer, an electron injection layer, and a hole blocking layer may form a common layer and remaining layers may form a separate independent layer.

The substrate may be a transparent insulating substrate or may be made of a ductile material. The substrate may include glass or a polymer material in a film having a glass transition temperature (Tg) of greater than about 150° C. For example, it includes a COC (cycloolefin copolymer) or COP (cycloolefin polymer) material. All the first to third electroluminescent devices are formed on the substrate. That is, a substrate of the display device according to an embodiment provides a common layer.

The driving circuit is disposed on the substrate and is independently connected to each of the first to third electroluminescent devices. The driving circuit may include at least one kind of line including a scan line, a data line, a driving power source line, a common power source line, and the like, at least two of thin film transistors (TFT) connected to the wire and corresponding to one organic light emitting diode, and at least one capacitor, or the like. The driving circuit may have a variety of the known structures.

As described above, a display device according to an embodiment may exhibit improved device efficiency and thus excellent photoluminescence characteristics.

Hereinafter, the embodiments are illustrated in more detail with reference to examples. However, these examples are exemplary, and the present disclosure is not limited thereto.

EXAMPLES

Preparation Example 1

$5 \times 10^{-5}$ millimoles (mmol) of red quantum dots (InP, average particle diameter: 9 nm) on which oleic acid is attached as a hydrophobic ligand and 2.66 mmol of a compound represented by Chemical Formula D (DOFL-TPD) are put in 10 mL of octane and stirred for 5 minutes, preparing a composition for an emission layer.

The compound represented by Chemical Formula D is included in an amount of 5 wt % based on a total weight of the quantum dots and the compound represented by Chemical Formula D.

Preparation Example 2

A composition for an emission layer is prepared according to the same method as Preparation Example 1 except that the amount of the compound represented by Chemical Formula D is adjusted into 10 wt % based on a total weight of the quantum dots and the compound represented by Chemical Formula D.

Preparation Example 3

A composition for an emission layer is prepared according to the same method as Preparation Example 1 except that the amount of the compound represented by Chemical Formula D is adjusted into 15 wt % based on a total weight of the quantum dots and the compound represented by Chemical Formula D.

Preparation Example 4

A composition for an emission layer is prepared according to the same method as Preparation Example 1 except that the amount of the compound represented by Chemical Formula D is adjusted into 20 wt % based on a total weight of the quantum dots and the compound represented by Chemical Formula D.

Preparation Example 5

$3.33 \times 10^{-5}$ mmol of blue quantum dots (ZnSeTe, average particle diameter: 13 nm) on which oleic acid is attached as a hydrophobic ligand and 2.66 mmol of a compound represented by Chemical Formula D (DOFL-TPD) are put in 10 mL of octane and stirred for 5 minutes, preparing a composition for an emission layer.

The compound represented by Chemical Formula D is included in an amount of 15 wt % based on a total weight of the quantum dots and the compound represented by Chemical Formula D.

Preparation Example 6

A composition for an emission layer is prepared according to the same method as Preparation Example 1 except using 3.64 mmol of the compound represented by Chemical Formula B (DOFL-NPB) instead of the compound represented by Chemical Formula D (DOFL-TPD) and adjusting the amount of the compound represented by Chemical Formula B into 5 wt % based on a total weight of the quantum dots and the compound represented by Chemical Formula B.

Preparation Example 7

A composition for an emission layer is prepared according to the same method as Preparation Example 6 except that the amount of the compound represented by Chemical Formula B is adjusted into 10 wt % based on a total weight of the quantum dots and the compound represented by Chemical Formula B.

Preparation Example 8

A composition for an emission layer is prepared according to the same method as Preparation Example 6 except that the amount of the compound represented by Chemical Formula B is adjusted into 15 wt % based on a total weight of the quantum dots and the compound represented by Chemical Formula B.

Preparation Example 9

A composition for an emission layer is prepared according to the same method as Preparation Example 6 except that the amount of the compound represented by Chemical Formula B is adjusted into 20 wt % based on a total weight of the quantum dots and the compound represented by Chemical Formula B.

Preparation Example 10

A composition for an emission layer is prepared according to the same method as Preparation Example 1 except that the amount of the compound represented by Chemical Formula D is adjusted into 30 wt % based on a total weight of the quantum dots and the compound represented by Chemical Formula D.

Preparation Example 11

A composition for an emission layer is prepared according to the same method as Preparation Example 6 except that the amount of the compound represented by Chemical Formula B is adjusted into 40 wt % based on a total weight of the quantum dots and the compound represented by Chemical Formula B.

Preparation Example 12

Red light emitting core-shell quantum dots (InP/ZnSeS, average particle diameter: 11 nm) on a surface of which oleic acid is attached as a hydrophobic ligand and a compound represented by Chemical Formula D (DOFL-TPD) are put in 10 mL of octane and stirred for 5 minutes, preparing a composition for an emission layer (concentration: $5 \times 10^{-5}$ mmol).

The compound represented by Chemical Formula D is included in an amount of 15 wt % based on a total weight of the quantum dots and the compound represented by Chemical Formula D.

Comparative Preparation Example 1

$5 \times 10^{-5}$ mmol of red quantum dots (InP, an average particle diameter: 9 nm) on which oleic acid is attached as a hydrophobic ligand are put in 10 mL of octane and stirred for 5 minutes, preparing a composition for an emission layer.

Comparative Preparation Example 2

$3.33 \times 10^{-5}$ mmol of blue quantum dots (ZnTeSe, an average particle diameter: 13 nm) on which oleic acid is attached as a hydrophobic ligand are added to 10 mL of octane and stirred for 5 minutes, preparing a composition for an emission layer.

Comparative Preparation Example 3

A composition for an emission layer is prepared according to the same method as Preparation Example 6 except that the amount of the compound represented by Chemical Formula B is adjusted into 50 wt % based on a total weight of the quantum dots and the compound represented by Chemical Formula B.

Comparative Preparation Example 4

A composition for an emission layer is prepared according to the same method as Preparation Example 1 except that the amount of the compound represented by Chemical Formula D is adjusted into 50 wt % based on a total weight of the quantum dots and the compound represented by Chemical Formula D.

Comparative Preparation Example 5

A composition for an emission layer is prepared according to the same manner as Preparation Example 12 except that the amount of the compound represented by Chemical Formula D is not used.

Comparative Preparation Example 6

A composition for an emission layer is prepared according to the same manner as Preparation Example 12 except that instead of the compound (DOFL-TPD) represented by Chemical Formula D, a compound having the following structure is used:

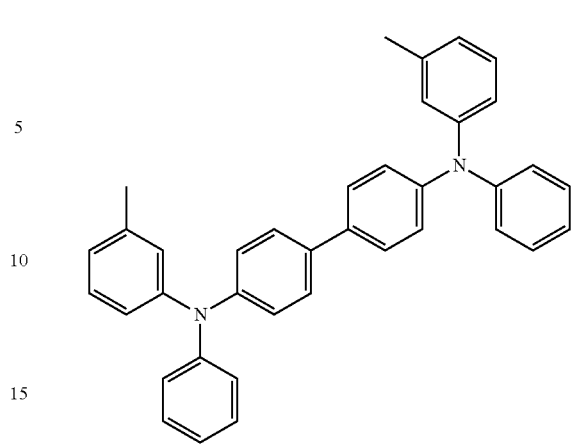

Evaluation 1: Surface Morphology of Emission Layer

The compositions for an emission layer according to Preparation Examples 3 and 5 and Comparative Preparation Examples 1 and 2 are respectively spin-coated on a glass substrate, thermally treated at 80° C. for 30 minutes to form each emission layer thin film having an average thickness of about 25 nm.

Subsequently, surface morphology of each emission layer thin film is measured through atomic-force microscopy (AFM), and the results are shown in FIGS. 2 to 5.

FIGS. 2 to 5 are atomic-force microscopic (AFM) images showing surface morphology of the emission layer thin films (Comparative Preparation Example 1 (FIG. 2), Preparation Example 3 (FIG. 3), Comparative Preparation Example 2 (FIG. 4), and Preparation Example 5 (FIG. 5)).

In FIGS. 2 to 5, each image has each width scale corresponding to 5 μm, and herein, as an image shows a brighter color, it is positioned relatively upper, but as it shows a darker color, it is positioned relatively lower.

Referring to FIGS. 2 to 5, the emission layer thin films in which a hole transporting material is blended based on the same kind of quantum dots according to Preparation Examples 3 and 5 show lower root mean square roughness (RMS) compared with those according to Comparative Preparation Examples 1 and 2 including no hole transporting material.

The results of FIGS. 2 to 5 show that an emission layer formed by blending a hole transporting material with quantum dots according to embodiment shows excellent surface morphology compared with an emission layer including only the quantum dots.

Evaluation 2: Hole Transporting Capability Evaluation of HOD

The compositions for an emission layer according to Preparation Examples 2 to 3 and 6 to 8 and Comparative Preparation Example 1 are respectively used to manufacture HOD (Hole Only Device). HOD may be manufactured by respectively spin-coating a solution for a hole injection layer prepared by dissolving PEDOT in water and a solution for a hole transport layer prepared by dissolving TFB in toluene on a patterned ITO electrode to sequentially form a hole injection layer and a hole transport layer, coating and drying a composition for an emission layer thereon to form an emission layer, depositing a material blocking holes passing the emission layer on the emission layer, and finally forming an Al electrode. The manufactured HOD may effectively sense only hole transporting capability.

Subsequently, after applying a voltage of 5 V and 8 V to HOD, current density measured in each emission layer is shown in Table 1.

TABLE 1

| Applied Voltage | Preparation Example 2 | Preparation Example 3 | Preparation Example 6 | Preparation Example 7 | Preparation Example 8 | Comparative Preparation Example 1 |
|---|---|---|---|---|---|---|
| 5 V | 0.08 mA/cm² | 0.67 mA/cm² | 0.06 mA/cm² | 0.47 mA/cm² | 0.77 mA/cm² | 0.01 mA/cm² |
| 8 V | 2.32 mA/cm² | 10.1 mA/cm² | 3.50 mA/cm² | 9.63 mA/cm² | 15.96 mA/cm² | 0.025 mA/cm² |

Referring to Table 1, HOD's manufactured by using the compositions for an emission layer according to the Preparation Examples show improved current density compared with HOD manufactured by using the compositions for an emission layer according to Comparative Preparation Example 1.

On the other hand, when the same kind of hole transporting material (comparison of Preparation Examples 2 and 3 and comparison of Preparation Examples 6 to 8) is used, as an amount of the hole transporting material is increased, current density also increases.

However, when different kinds of hole transporting materials (comparison of Preparation Examples 2 to 3 and Preparation Examples 6 to 8) is used, current density also becomes different.

Referring to the result of Table 1, HOD's according to Preparation Examples show much improved hole transporting capability through the emission layer formed by blending quantum dots and a hole transporting material.

Evaluation 3: Surface Characteristics of Emission Layer Depending on Content of First Hole Transport Material The compositions for an emission layer according to Preparation Examples 10 to 11 and Comparative Preparation Examples 3 to 4 are respectively coated and dried on a glass substrate to form emission layer thin films, the surface of each emission layer thin films is measured by using a scanning electron microscope, and the results are shown in FIGS. 6 to 9.

FIGS. 6 to 9 are scanning electron microscopic images of the emission layer thin films (Comparative Preparation Example 3 (FIG. 6), Comparative Preparation Example 4 (FIG. 7), Preparation Example 10 (FIG. 8), and Preparation Example 11 (FIG. 9)).

Referring to FIGS. 6 to 9, the emission layers according to Preparation Examples 10 to 11 show a relatively uniform surface distribution, but when a first hole transporting material is excessively included, a phase separation may occur as shown in Comparative Preparation Examples 3 to 4.

Accordingly, referring to the result of Evaluation 3, the electroluminescent devices according to Examples include a first hole transporting material in an emission layer within the above range and thus may prevent a phase separation on the surface of the emission layer and secure excellent surface roughness.

Evaluation 3-1: Time Resolved Photoluminescence Analysis of the Emission Layer

Using the compositions of Preparation Example 12 and Comparative Preparation Example 5, Emission Film 1 (QD:TPD film) and Emission Film 2 (QD only film) are formed, respectively. DOFL-TPD (hereinafter, also may be abbreviated as "TPD" e.g., Table 2) is dissolved in octane to form a solution, which is then used to form a TPD film.

Using fluorescence lifetime spectrometer ("picoquant fluotime 300" by PicoQuant Co. Ltd.), a TRPL analysis is made for each of Emission Film 1, Emission Film 2, and TPD Film and the results are summarized in Table 2, FIG. 14 and FIG. 15.

TABLE 2

| | TPD film | QD + TPD 15% $\lambda_{probe}$ TPD | QD only | QD + TPD 15% $\lambda_{probe}$ QD |
|---|---|---|---|---|
| t1 | 0.8 (100%) | 0.3 (100%) | 9 (0%) | 9 (24%) |
| t2 | — | — | 27 (95%) | 27 (72%) |
| t3 | — | — | 110 (5%) | 110 (4%) |
| $t_{avg}$ | 0.8 | 0.3 | 31 | 26 |

Figure 14:
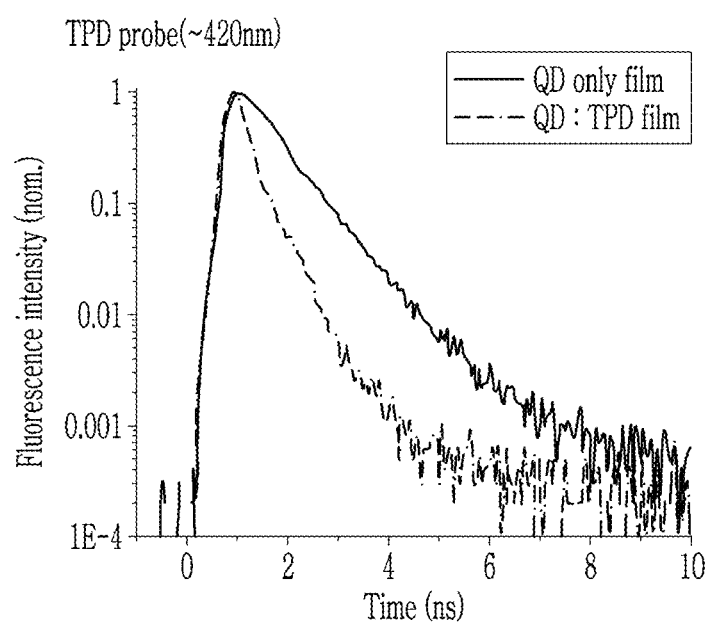
FIG. 14 is a graph of fluorescence intensity (nominal units) versus time (nanoseconds, ns) and shows results of time resolved photoluminescence spectroscopy analysis with respect to the emission at a wavelength of 420 nm (TPD probe) for the films of the compositions of Preparation Example 12 and Comparative Preparation Example 5.
Figure 15:
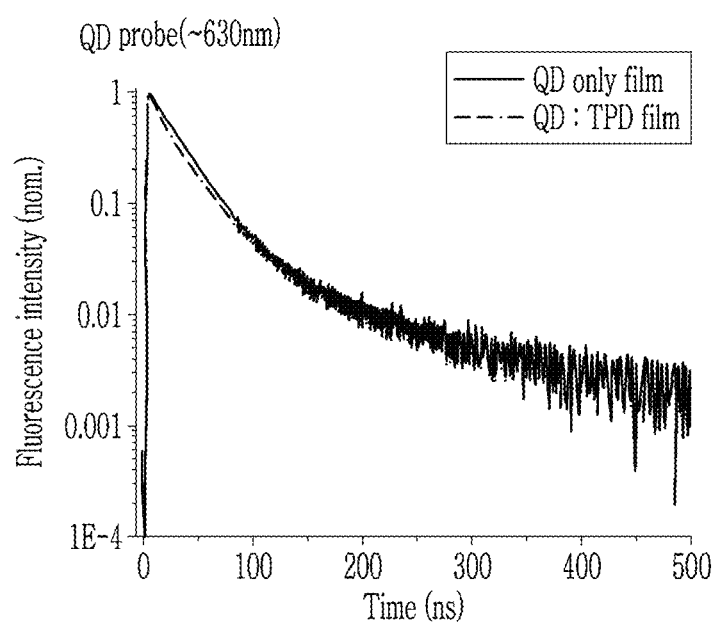
FIG. 15 is a graph of fluorescence intensity (nominal units) versus time (nanoseconds, ns) shows results of time resolved photoluminescence spectroscopy analysis with respect to the emission at a wavelength of 630 nm (QD probe) for the films of the compositions of Preparation Example 12 and Comparative Preparation Example 5.

The results of Table 2 and FIGS. 14 and 15 confirm that the decay time of the first hole transporting material is significantly reduced by a mixing with the quantum dots and that for the excitons related with the quantum dot emission, a component of a very fast decay (fast initial decay) appears. The results indicate that the decay path of the exitons in Emission Film 1 becomes different (changes) from that in Emission Film 2.

Evaluation 3-2: Photoluminescence Excitation Analysis of the Emission Film

Figure 16:
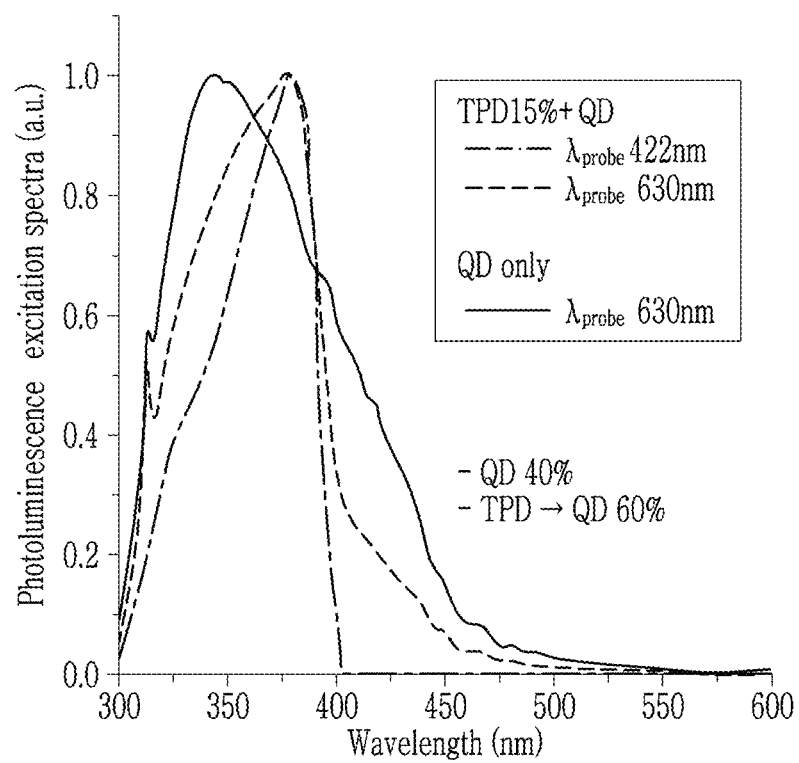
FIG. 16 is a graph of emission intensity (arbitrary units, a.u.) versus excitation wavelength (nanometers, nm) and shows results of analyzing excitation wavelength dependent photoluminescence emission behaviors for the films prepared from the compositions of Preparation Example 12 and Comparative Preparation Example 5.

Using Fluorescence Spectrophotometer (Hitachi F7000), photoluminescent emission behavior of Emission Film 1 (QD:TPD film) and Emission Film 2 (QD only film) is observed with varying a wavelength of excitation light from 300 nm to 600 nm and the results are summarized in FIG. 16.

From the results of FIG. 16, the photoluminescent emission behavior in Emission Film 2 is clearly different from that in Emission Film 1. In Emission Film 1, a contribution rate of the quantum dots themselves for the red light emission is about 40% while a contribution rate of the quantum dots and the TPD is about 60%.

In Emission Film 1, when the wavelength of the excitation light is the photoluminescent wavelength of the TPD (i.e., 422 nm), the intensity of the emitted light is less than about 0.4 (e.g., less than or equal to about 0.2) of the maximum intensity the emitted light (i.e., 1). When the wavelength of the excitation light is 450 nm, the intensity of the emitted light is less than or equal to about 0.1 of the maximum intensity the emitted light.

Evaluation 3-3: Photoluminescence Analysis of the Emission Film

Compositions are prepared in the same manner as Preparation Example 12 except that the amount of the DOFL-TPD is changed into 0 wt %, 5 wt %, 10 wt %, 15 wt %, and 20 wt %, respectively and using each of the prepared composition, a emission film is prepared.

Using Fluorescence Spectrophotometer (Hitachi F7000), a photoluminescent characteristic is analyzed for each of the prepared emission film with excitation light having a wavelength of 380 nm or 530 nm, and the results (a relative intensity of emission calculated from a spectrum area) are summarized in Table 3.

TABLE 3

| | Relative intensity of emission (%) at excitation of 380 nm | Relative intensity of emission (%) at excitation of 530 nm |
|---|---|---|
| QD only | 100% | 100% |
| TPD 5% | 113% | 85% |
| TPD 10% | 142% | 83% |
| TPD 15% | 129% | 83% |
| TPD 20% | 141% | 77% |

With an excitation light of 380 nm, an increase of the amount of TPD brings forth an increase of the photoluminescence of the QDs. With an excitation light of 530 nm, only the QDs are excited and thus an increase of the amount of TPD brings forth a decrease of the PL, this is consistent with a decrease of the number of the QDs.

Example 1

A glass substrate deposited with ITO as a first electrode (an anode) is surface-treated with UV-ozone for 15 minutes, a hole injection layer having an average thickness of 30 nm is formed thereon by spin-coating a PEDOT:PSS solution (H. C. Starks) and thermally treating it at 150° C. for 10 minutes under an air atmosphere and then, at 150° C. for 10 minutes under a $N_2$ atmosphere.

Subsequently, a hole transport layer having an average thickness of 25 nm is formed on the hole injection layer by spin-coating a solution for a hole transport layer prepared by dissolving poly[(9,9-dioctylfluoren-2,7-diyl)-co-(4,4'-(N-4-butylphenyl)diphenylamine)] (TFB) (Sumitomo) in toluene and thermally treating it at 150° C. for 30 minutes.

Subsequently, the composition for an emission layer according to Preparation Example 1 is spin-coated on the hole transport layer and heated at 80° C. to form a red emission layer (red light emitting layer) having an average thickness of 25 nm.

On the red emission layer, an electron transport layer having an average thickness of 80 nm is formed by spin-coating a solution for an electron transport layer in which ZnO is dispersed in ethanol and then, thermally treating it at 80° C. for 30 minutes.

Subsequently, a second electrode is formed by vacuum-depositing aluminum (Al) to an average thickness of 90 nm on the electron transport layer to manufacture an electroluminescent device according to Example 1.

Example 2

An electroluminescent device according to Example 2 is manufactured according to the same method as Example 1, except that the composition for an emission layer according to Preparation Example 2 is used instead of the composition for an emission layer according to Preparation Example 1.

Example 3

An electroluminescent device according to Example 3 is manufactured according to the same method as Example 1, except that the composition for an emission layer according to Preparation Example 3 is used instead of the composition for an emission layer according to Preparation Example 1.

Example 4

An electroluminescent device according to Example 4 is manufactured according to the same method as Example 1, except that the composition for an emission layer according to Preparation Example 4 is used instead of the composition for an emission layer according to Preparation Example 1.

Example 5

An electroluminescent device according to Example 5 is manufactured according to the same method as Example 1, except that the composition for an emission layer according to Preparation Example 2 is used instead of the composition for an emission layer according to Preparation Example 1 and the electron transport layer is formed with an average thickness of 60 nm.

Example 6

An electroluminescent device according to Example 6 is manufactured according to the same method as Example 1, except that the composition for an emission layer according to Preparation Example 3 is used instead of the composition for an emission layer according to Preparation Example 1 and the electron transport layer is formed with an average thickness of 60 nm.

Example 7

An electroluminescent device according to Example 7 is manufactured according to the same method as Example 1, except that the composition for an emission layer according to Preparation Example 3 is used instead of the composition for an emission layer according to Preparation Example 1, the emission layer is formed with an average thickness of 30 nm, and the electron transport layer is formed with an average thickness of 60 nm.

Example 8

An electroluminescent device according to Example 8 is manufactured according to the same method as Example 1, except that the composition for an emission layer according to Preparation Example 3 is used instead of the composition for an emission layer according to Preparation Example 1 and the emission layer is formed with an average thickness of 30 nm.

Example 9

An electroluminescent device according to Example 9 is manufactured according to the same method as Example 1, except that the composition for an emission layer according to Preparation Example 6 is used instead of the composition for an emission layer according to Preparation Example 1.

Example 10

An electroluminescent device according to Example 10 is manufactured according to the same method as Example 1, except that the composition for an emission layer according to Preparation Example 7 is used instead of the composition for an emission layer according to Preparation Example 1.

Example 11

An electroluminescent device according to Example 11 is manufactured according to the same method as Example 1, except that the composition for an emission layer according to Preparation Example 8 is used instead of the composition for an emission layer according to Preparation Example 1.

Example 12

An electroluminescent device according to Example 12 is manufactured according to the same method as Example 1, except that the composition for an emission layer according to Preparation Example 9 is used instead of the composition for an emission layer according to Preparation Example 1.

Example 13

An electroluminescent device according to Example 13 is manufactured according to the same method as Example 1, except that the composition for an emission layer according to Preparation Example 7 is used instead of the composition for an emission layer according to Preparation Example 1 and the electron transport layer is formed with an average thickness of 60 nm.

Example 14

An electroluminescent device according to Example 14 is manufactured according to the same method as Example 1, except that the composition for an emission layer according to Preparation Example 8 is used instead of the composition for an emission layer according to Preparation Example 1 and the electron transport layer is formed with an average thickness of 60 nm.

Example 15

The composition for an emission layer according to Preparation Example 15 is spin-coated on the hole transport layer and heated at 80° C. to form a red light emission layer having an average thickness of 20 nm.

A solution for an electron transport layer having ZnMgO nanoparticles dispersed in ethanol is spin-coated on the red light emission layer, and then is thermally treated at 80° C. for 30 minutes to form an electron transport layer having an average thickness of 40 nm.

Then, a second electrode is formed by vacuum-depositing aluminum (Al) to an average thickness of 100 nm on the electron transport layer to obtain an electroluminescent device.

Comparative Example 1

An electroluminescent device according to Comparative Example 1 is manufactured according to the same method as Example 1, except that the composition for an emission layer according to Comparative Preparation Example 1 is used instead of the composition for an emission layer according to Preparation Example 1.

Comparative Example 2

An electroluminescent device according to Comparative Example 2 is manufactured according to the same method as Example 1, except that the composition for an emission layer according to Comparative Preparation Example 2 is used instead of the composition for an emission layer according to Preparation Example 1 and the electron transport layer is formed with an average thickness of 60 nm.

Comparative Example 3

An electroluminescent device is manufactured in the same manner as Example 12, except that the composition of Comparative Preparation Example 5 is used instead of the composition of Preparation Example 12.

Comparative Example 4

An electroluminescent device is manufactured in the same manner as Example 12, except that the composition of Comparative Preparation Example 6 is used instead of the composition of Preparation Example 12.

A serious phase segregation occurs during the formation of the emission layer and the manufactured device does not show a luminescent characteristic.

Evaluation 4: Voltage-Current Density Relationship Depending on Content of Hole Transporting Material in Emission Layer Voltage-current density relationship of the electroluminescent devices according to Examples 1 to 4 and Comparative Example 1 and of the electroluminescent devices according to Examples 9 to 12 and Comparative Example 2 are measured and respectively shown in FIGS. 10 and 11.

Figure 10:
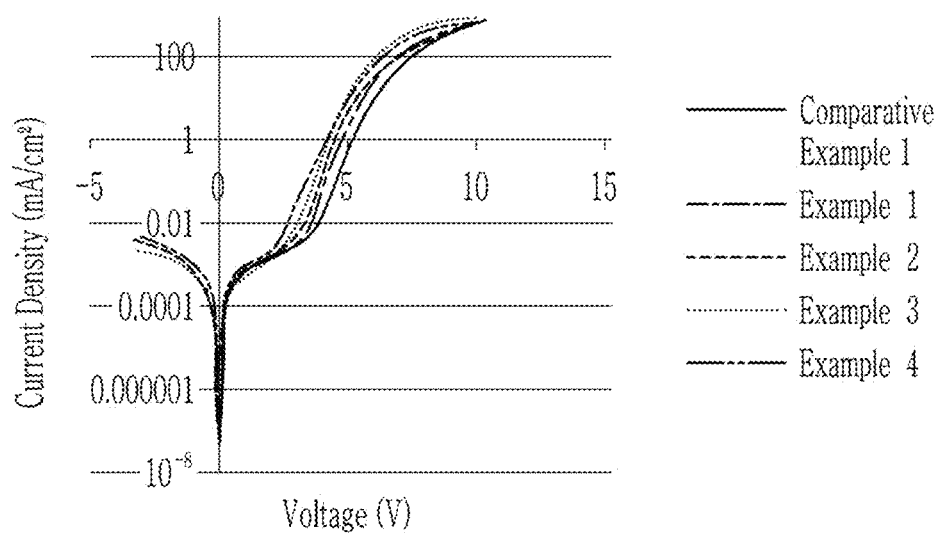
FIG. 10 is a graph of current density (milliamperes per square centimeter, mA/cm$^2$) versus voltage (volts, V) showing voltage-current density (log scale) characteristics of the electroluminescent devices according to Examples 1 to 4 and Comparative Example 1.
Figure 11:
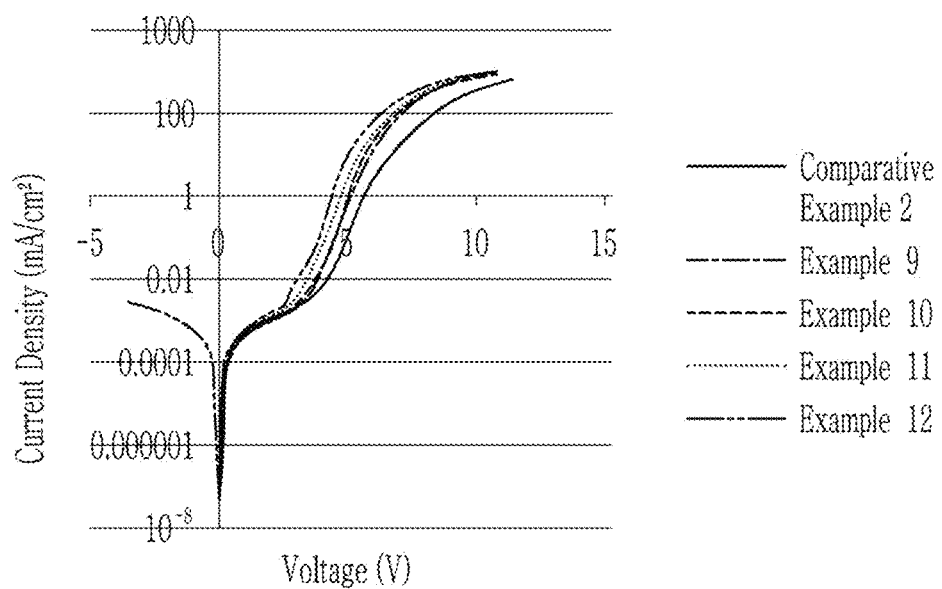
FIG. 11 is a graph of current density (mA/cm$^2$) versus voltage (V) showing voltage-current density (log scale) characteristics of the electroluminescent devices according to Examples 9 to 12 and Comparative Example 2.

FIG. 10 is a graph showing voltage-current density (log scale) characteristics of the electroluminescent devices according to Examples 1 to 4 and Comparative Example 1 and FIG. 11 is a graph showing voltage-current density (log scale) characteristics of the electroluminescent devices according to Examples 9 to 12 and Comparative Example 2.

Referring to FIGS. 10 and 11, a turn-on voltage of a device is gradually lower, as an amount of a hole transporting material is increased in an emission layer under the predetermined conditions (i.e., same kind of emission layer and same thickness of an electron transport layer of FIG. 10, and Examples 9 to 12 of FIG. 11).

Referring to the results of FIGS. 10 and 11, the electroluminescent devices according to Examples show improved hole transporting capability compared with those according to Comparative Examples, and as an amount of the hole transporting material is increased in the emission layer, the hole transporting capability is gradually improved.

Evaluation 5: Relationship of Average Thickness of Electron Transport Layer and Device Characteristics Device characteristics of the electroluminescent devices according to Examples 2, 6, 11, 13 and Comparative Examples 1 and 2 are measured and shown in Table 4.

TABLE 4

| | Max. EQE | EQE @ 100 nt | EQE @ 500 nt | EQE @ 1000 nt | Max Current efficiency (Cd/A) | Driving Voltage (V) @ 5 mA/cm$^2$ | Luminance @ 5 mA/cm$^2$ (Cd/m$^2$) | Lamda max. (nm) | FWHM (nm) | CIE x | CIE y | Max Luminance (Cd/m$^2$) |
|---|---|---|---|---|---|---|---|---|---|---|---|---|
| Example 2 | 3.6 | 2.3 | 3.3 | 3.6 | 4.5 | 2.6 | 175 | 627 | 37 | 0.6830 | 0.3150 | 17240 |
| Example 6 | 4.1 | 2.8 | 3.8 | 4.0 | 5.3 | 2.8 | 220 | 626 | 37 | 0.6820 | 0.3161 | 16230 |
| Example 11 | 3.5 | 2.6 | 3.3 | 3.5 | 4.3 | 2.7 | 178 | 627 | 37 | 0.6850 | 0.3140 | 14040 |
| Example 13 | 5.2 | 3.7 | 4.9 | 5.1 | 6.6 | 2.8 | 301 | 626 | 37 | 0.6820 | 0.3160 | 10780 |

TABLE 4-continued

| | Max. EQE | EQE @ 100 nt | EQE @ 500 nt | EQE @ 1000 nt | Max Current efficiency (Cd/A) | Driving Voltage (V) @ 5 mA/cm² | Luminance @ 5 mA/cm² (Cd/m²) | Lamda max. (nm) | FWHM (nm) | CIE x | CIE y | Max Luminance (Cd/m²) |
|---|---|---|---|---|---|---|---|---|---|---|---|---|
| Comparative Example 1 | 3.8 | 2.2 | 3.7 | 3.6 | 4.7 | 3.0 | 182 | 627 | 37 | 0.6840 | 0.3140 | 6850 |
| Comparative Example 2 | 4.2 | 3.0 | 3.9 | 4.1 | 5.3 | 2.8 | 228 | 627 | 37 | 0.6830 | 0.3160 | 7170 | nt = nit

Referring to Table 2, based on the average thickness of the same kind of electron transport layers (comparison of Examples 2 and 11 and Comparative Example 1 and comparison of Examples 6 and 13 and Comparative Example 2), specific device characteristics may be a little different depending on a kind of hole transporting material included in an emission layer, but Examples show remarkably excellent maximum luminance (Max luminance) compared with at least Comparative Examples. On the other hand, based on the same hole transporting material (comparison of Examples 2 and 6 and comparison of Examples 11 and 13), device characteristics such as external quantum efficiency (EQE), maximum luminance (Max luminance), or the like may be different depending on an average thickness of the electron transport layer (ETL).

Figure 8:
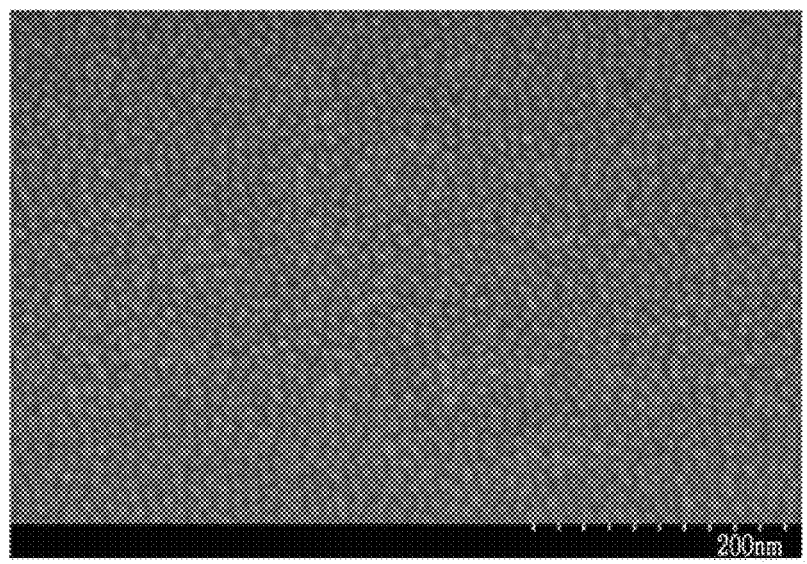
Figure 9:
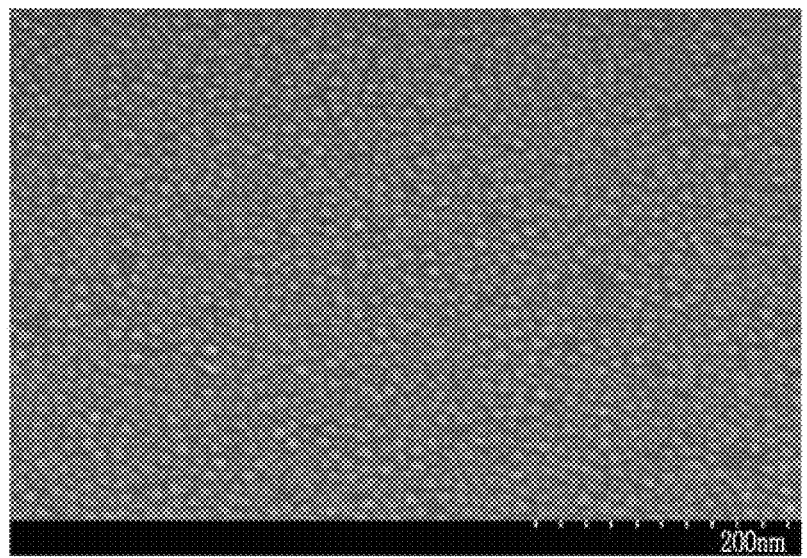

On the other hand, life-span characteristics of the electroluminescent devices according to Examples 2, 5, 11, and 14 and Comparative Examples 1 and 2 are respectively evaluated and the results are shown in Table 5 and FIG. 8.

Figure 12:
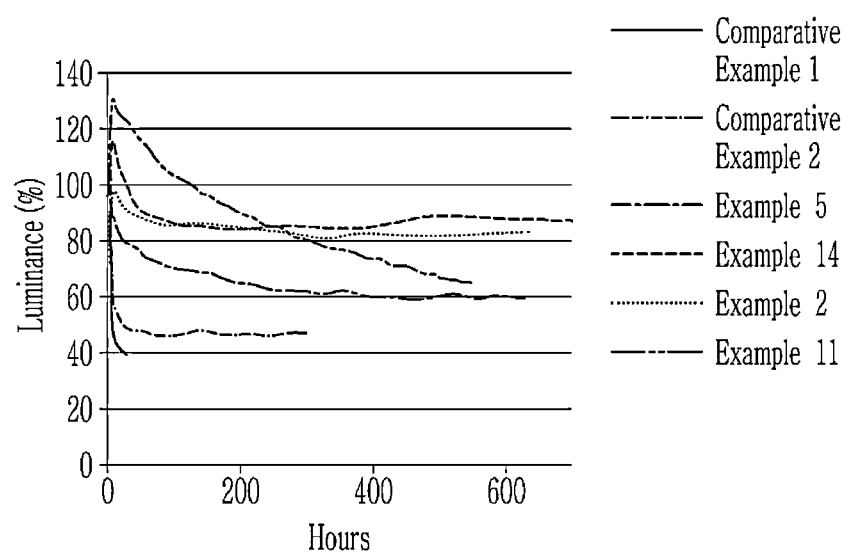
FIG. 12 is a graph of luminance (%) versus time (hours) showing life-span characteristics of the electroluminescent devices according to Examples 2, 5, 11, and 14 and Comparative Examples 1 and 2.

FIG. 12 is a graph showing life-span (i.e., lifetime) characteristics of the electroluminescent devices (at 500 nit) according to Examples 2, 5, 11, and 14 and Comparative Examples 1 and 2.

TABLE 5

| | T95 (h) | T50 (h) |
|---|---|---|
| Example 2 | 0.09 | greater than 1,000 |
| Example 5 | 0.09 | greater than 1,000 |
| Example 11 | 154.91 | about 700 |

TABLE 5-continued

| | T95 (h) | T50 (h) |
|---|---|---|
| Example 14 | 34.35 | greater than 1,000 |
| Comparative Example 1 | 0.03 | 4.8 |
| Comparative Example 2 | 0.03 | 0.9 |

T95 indicates the time (h) clasped until the luminance is 95% of an initial luminance (100%), and T50 indicates the time (h) clasped until the luminance is 50% of an initial luminance (100%).

Referring to FIG. 12 and Table 3, based on the same thickness of the electron transport layers (comparison of Examples 2 and 11 and Comparative Example 1 and comparison of Examples 5 and 14 and Comparative Example 2), the electroluminescent devices according to Examples show excellent T50 and T95 compared with those of Comparative Examples. On the other hand, based on the same hole transporting material (comparison of Examples 2 and 5 with Comparative Example 1, comparison of Examples 11 and 14 with Comparative Example 2), life-span characteristics may also be different depending on an average thickness of an electron transport layer (particularly, referring to Examples 11 and 14).

Accordingly, referring to the result of Evaluation 5, the electron transport layer may have a different optimal average thickness depending on a kind of a hole transporting material included in an emission layer.

Evaluation 6: Relationship Between Average Thickness of Electron Transport Layer and Emission Layer and Device Characteristics Device characteristics of the electroluminescent devices according to Examples 3, 6, 7, and 8 and Comparative Examples 1 and 2 are measured, and the results are shown in Table 6.

TABLE 6

| | Max. EQE | EQE @ 100 nt | EQE @ 500 nt | EQE @ 1000 nt | Max Current efficiency (Cd/A) | Driving Voltage (V) @ 5 mA | Luminance @ 5 mA (Cd/m²) | Lamda max. (nm) | FWHM (nm) | CIE x | CIE y | Max Luminance (Cd/m²) |
|---|---|---|---|---|---|---|---|---|---|---|---|---|
| Example 3 | 3.6 | 2.3 | 3.3 | 3.6 | 4.5 | 2.6 | 175 | 627 | 37 | 0.6830 | 0.3150 | 17240 |
| Example 6 | 4.1 | 2.8 | 3.8 | 4.0 | 5.3 | 2.8 | 220 | 626 | 37 | 0.6820 | 0.3161 | 16230 |
| Example 7 | 2.8 | 2.2 | 2.6 | 2.8 | 3.6 | 2.7 | 149 | 626 | 37 | 0.6820 | 0.3160 | 15510 |
| Example 8 | 2.8 | 2.4 | 2.7 | 2.8 | 3.4 | 2.7 | 156 | 628 | 38 | 0.6850 | 0.3140 | 19560 |
| Comparative Example 1 | 3.8 | 2.2 | 3.7 | 3.6 | 4.7 | 3.0 | 182 | 627 | 37 | 0.6840 | 0.3140 | 6850 |
| Comparative Example 2 | 4.2 | 3.0 | 3.9 | 4.1 | 5.3 | 2.8 | 228 | 627 | 37 | 0.6830 | 0.3160 | 7170 |

Referring to Table 4, based on the same average thickness of the electron transport layers (comparison of Examples 3 and 8 with Comparative Example 1 and comparison of Examples 6 and 7 with Comparative Example 2), maximum luminance depending on the average thickness of the emission layer may be opposite each other. In other words, as for Examples 3 and 8, as the average thickness of the emission layer is increased, the maximum luminance increases, but as for Examples 6 and 7, the maximum luminance rather decreases with increased emission layer thickness. On the other hand, life-span characteristics of the electroluminescent devices according to Examples 3, 6, 7, and 8 and Comparative Examples 1 and 2 are respectively evaluated, and the results are shown in Table 7 and FIG. 13.

Figure 13:
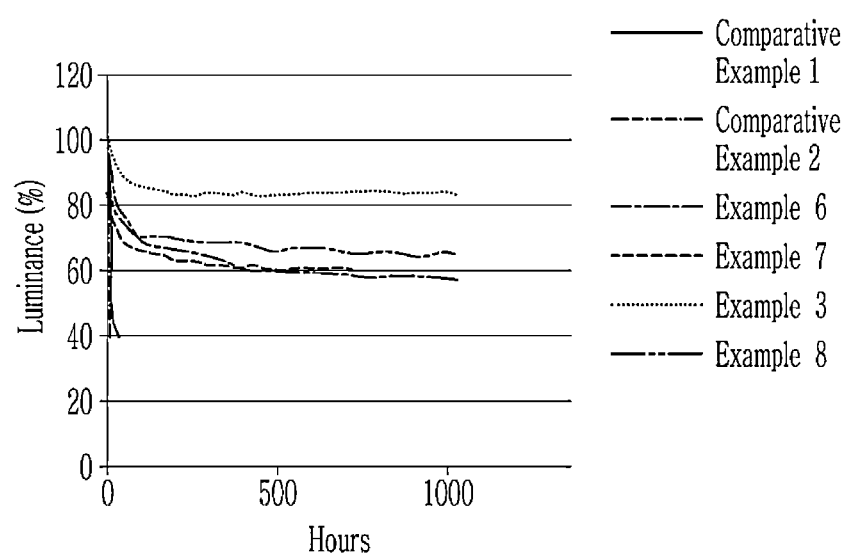
FIG. 13 is a graph of luminance (%) versus time (hours) showing life-span characteristics of the electroluminescent devices according to Examples 3, 6, 7, and 8 and Comparative Examples 1 and 2.

FIG. 13 is a graph showing life-span characteristics of the electroluminescent devices according to Comparative Examples 1 to 2 and Examples 3, 6, 7, and 8.

TABLE 7

|  | T95 (h) | T50 (h) |
| --- | --- | --- |
| Example 3 | 0.09 | greater than 1,000 |
| Example 6 | 0.09 | greater than 1,000 |
| Example 7 | 0.07 | greater than 1,000 |
| Example 8 | 1.02 | greater than 1,000 |
| Comparative Example 1 | 0.03 | 4.8 |
| Comparative Example 2 | 0.03 | 0.9 |

Referring to FIG. 13 and Table 5, based on the same thickness of the electron transport layers (comparison of Examples 3 and 8 with Comparative Example 1 and comparison of Examples 6 and 7 with Comparative Example 2), the electroluminescent device according to Examples show excellent T50 and T95 compared with those according to Comparative Examples. On the other hand, based on the same hole transporting material and the same average thickness of the electron transport layers (comparison of Examples 6 and 7 and comparison of Examples 3 and 8) and particularly, referring to T95 of Examples 7 and 8, life-span characteristics may be different, as a thickness of the emission layer is changed. However, life-span characteristics of Examples 3, 6, 7, and 8 show excellent T50 of greater than 1,000 hours.

Accordingly, referring to the result of Evaluation 6, an average thickness of the emission layer has an influence on device characteristics, and accordingly, the device characteristics may be adjusted by controlling an average thickness of the electron transport layer and an average thickness of the emission layer.

Evaluation 7: Electroluminescent Properties and Lifetime of the Manufactured Device Device characteristics and lifetime of the electroluminescent devices of Example 15 and Comparative Example 3 are measured, and the results are summarized in Table 8.

T80(h): time (in hours) taken to reach relative luminance 80% relative to initial luminance when the device is operated at 1500 nit is measured.

T95(h): time (in hours) taken to reach relative luminance 95% relative to initial luminance when the device is operated at 1500 nit is measured

TABLE 8

|  | EQE Max (%) | Lum Max (cd/m$^2$) | Lamda Max (nm) | T95(h)@ 1500 nit | T80(h)@ 1500 nit |
| --- | --- | --- | --- | --- | --- |
| Comp. Example 3 | 15.5 | 112920 | 631 | 83.9 | 465.8 |
| Example 15 | 16.5 | 127760 | 631 | 484.4 | 1619.8 |

The results of Table 8 confirm that the electroluminescent device of the Example shows an increased lifetime together with improved electroluminescent properties.

Evaluation 8: The Device Property During the Application of an AC Voltage

A maximum capacitance over the changes of the voltage is measured while an AC voltage is applied to the electroluminescent device of Example 15 and Comparative Example 3 and the results are summarized in Table 9.

TABLE 9

|  | Maximum Capacitance (nF) |
| --- | --- |
| Example15 | 11 |
| Comp. Example 3 | 7 |

The results of the tests confirm that for the device of Example 15, a driving voltage may slightly decrease and a charge accumulated at an interface of HTL/QD may be changed and a luminance at a low voltage may increase. The results also indicate an improved mobility in the mixed emission layer.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. An electroluminescent device, comprising
a first electrode and a second electrode facing each other;
an emission layer disposed between the first electrode and the second electrode and comprising:
    a plurality of quantum dots, and
    a first material,
wherein the quantum dots are configured to emit a first light upon excitation by light, and the first material is configured to emit a second light upon excitation by light,
wherein the first light has a first peak wavelength and the second light has a second peak wavelength,
wherein in a time resolved photoluminescence analysis of the emission layer, t1 for the first light is less than or equal to about 15 nanoseconds,
wherein the first peak wavelength is less than or equal to 680 nanometers, and the second peak wavelength is less than the first peak wavelength,
wherein a difference between the second peak wavelength and the first peak wavelength is greater than or equal to 50 nanometers, and
wherein on an application of a voltage, the emission layer emits light of the same color as the first light,
wherein the first material comprises a compound represented by Chemical Formula 2-1 or Chemical Formula 2-2:

Chemical Formula 2-1

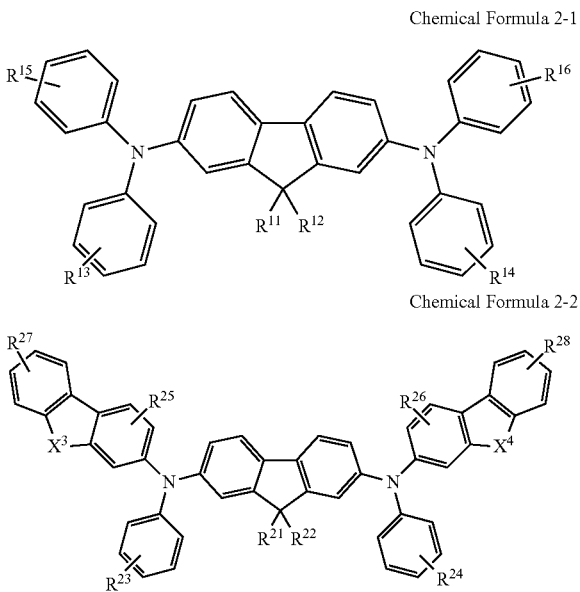

Chemical Formula 2-2 wherein, in Chemical Formula 2-1 to Chemical Formula 2-2,
X$^3$ and X$^4$ are independently selected from N—R$^b$ or C(—R$^c$)(—R$^d$), wherein R$^b$, R$^c$, and R$^d$ are each independently selected from hydrogen, or a substituted or unsubstituted C1 to C20 alkyl group, R$^{11}$, R$^{12}$, R$^{13}$, R$^{14}$, R$^{15}$, R$^{16}$, R$^{21}$, R$^{22}$, R$^{23}$, R$^{24}$, R$^{25}$, and R$^{26}$ are each independently hydrogen, a C1 to C3 alkyl group, a substituted or unsubstituted C4 to C20 alkyl group, a substituted or unsubstituted C6 to C20 aryl group, or a substituted or unsubstituted C3 to C20 heteroaryl group, provided that at least one of R$^{11}$ to R$^{14}$ and at least one of R$^{21}$ to R$^{26}$ are a substituted or unsubstituted C4 to C20 alkyl group, when R$^{13}$ or R$^{14}$ is a substituted or unsubstituted C6 to C20 aryl group, or a substituted or unsubstituted C3 to C20 heteroaryl group, then it is optionally fused with an adjacent aromatic ring to provide a C8 to C40 fused ring, and R$^{27}$ and R$^{28}$ are each independently hydrogen, a C1 to C3 alkyl group, a substituted or unsubstituted C12 to C40 arylamine group, or a substituted or unsubstituted carbazolyl group, wherein at least one substituent of the substituted C4 to C20 alkyl group, the substituted C1 to C20 alkyl group, the substituted C6 to C20 aryl group, the substituted C3 to C20 heteroaryl group, the substituted C12 to C40 arylamine group, the substituted methylene group, the substituted C2 to C4 alkenylene group, and the substituted carbazolyl group is a halogen group, a hydroxy group, a C1 to C30 alkoxy group, a C1 to C20 alkyl group, a C6 to C30 aryl group, or a combination thereof.

2. The electroluminescent device of claim 1, wherein a full width at half maximum of the light emitted from the emission layer is less than or equal to 60 nanometers.

3. The electroluminescent device of claim 1, wherein the difference between the second peak wavelength and the first peak wavelength is greater than or equal to 100 nanometers and a full width at half maximum of the light emitted from the emission layer is less than or equal to 60 nanometers.

4. The electroluminescent device of claim 1, wherein in a time resolved photoluminescence analysis of the emission layer, a decay fraction at the t1 for the first light is greater than or equal to about 5%.

5. The electroluminescent device of claim 1, wherein in a time resolved photoluminescence analysis of the emission layer,
an average decay time ($t_{avg}$) for the first light is less than or equal to about 30 nanoseconds; or
an average decay time ($t_{avg}$) for the second light is less than or equal to about 0.7 nanoseconds.

6. The electroluminescent device of claim 1, wherein in an analysis for an excitation wavelength dependent photoluminescence emission behavior, the emission layer shows a luminance intensity that is less than or equal to about 0.4 of a maximum intensity thereof, when an excitation light has a wavelength of the second peak wavelength.

7. The electroluminescent device of claim 1, wherein the second peak wavelength is less than or equal to about 590 nanometers.

8. The electroluminescent device of claim 1, wherein a full width at half maximum of the light emitted from the emission layer is less than or equal to 50 nanometers.

9. The electroluminescent device of claim 1, wherein the emission layer is configured to emit light without a formation of a triplet emitter.

10. The electroluminescent device of claim 1, wherein the first peak wavelength is in a range of from about 600 nanometers to about 650 nanometers, in a range of from about 500 nanometers to about 580 nanometers, or in a range of 440 nanometers to about 470 nanometers.

11. The electroluminescent device of claim 1, wherein the first material comprises an organic material.

12. The electroluminescent device of claim 1, wherein the first material comprises a substituted or unsubstituted C4 to C20 alkyl group attached to a backbone structure.

13. The electroluminescent device of claim 1, wherein the first material comprises a compound represented by any of Chemical Formula B, Chemical Formula C, Chemical Formula D, or Chemical Formula F:

Chemical Formula B

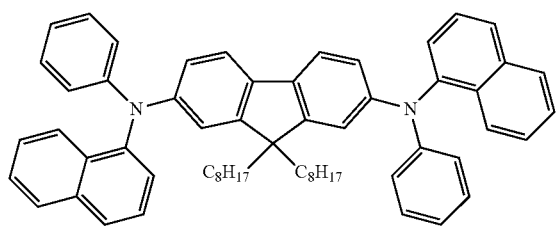

Chemical Formula C

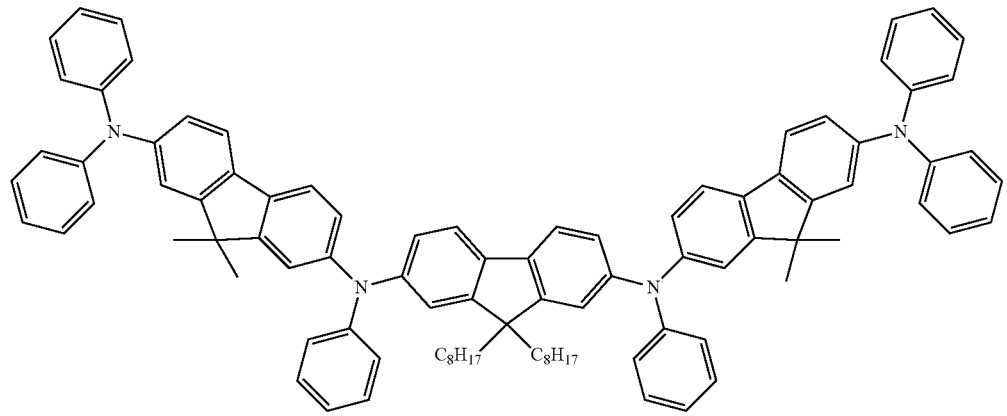

Chemical Formula D

Chemical Formula F

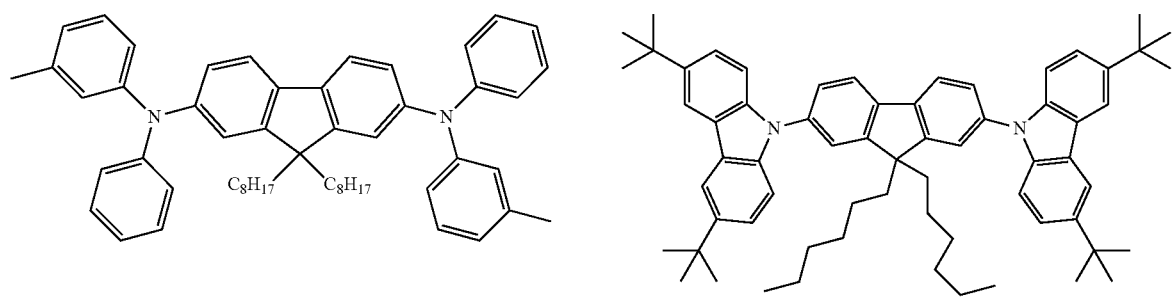

14. The electroluminescent device of claim 1, wherein the first material is included in an amount of greater than or equal to 2 weight percent and less than 30 weight percent based on a total weight of the emission layer.

15. The electroluminescent device of claim 1, wherein the emission layer does not comprise cadmium, lead, or a combination thereof.

16. The electroluminescent device of claim 1, wherein the plurality of quantum dots comprises a Group II-VI compound, a Group III-V compound, a Group IV-VI compound, a Group IV element or compound, a Group I-III-VI compound, a Group I-II-IV-VI compound, or a combination thereof.

17. The electroluminescent device of claim 1, wherein the electroluminescent device further comprises
a hole transport layer disposed between the emission layer and the first electrode and comprising a hole transporting material;
an electron transport layer disposed between the emission layer and the second electrode;

or
a combination thereof.

18. The electroluminescent device of claim 17, wherein the electron transport layer comprises a plurality of inorganic nanoparticles and the inorganic nanoparticle comprises a compound represented by Chemical Formula A:

$$Zn_{1-x}M_xO$$                    Chemical Formula A wherein, in Chemical Formula 1,
M is Mg, Ca, Zr, W, Li, Ti, Y, Al, or a combination thereof, and
$0 \leq x \leq 0.5$.

19. The electroluminescent device of claim 1, wherein the electroluminescent device exhibits a maximum external quantum efficiency (EQE) of greater than or equal to about 10%, a maximum luminance of greater than or equal to about 50,000 candela per square meter, a T95 of greater than or equal to about 400 hours, or a combination thereof.

20. A display device comprising the electroluminescent device of claim 1.

* * * * *